(12) United States Patent
Kong et al.

(10) Patent No.: US 11,737,330 B2
(45) Date of Patent: Aug. 22, 2023

(54) TILED DISPLAY DEVICE

(71) Applicant: Samsung Display Co., Ltd., Yongin-si (KR)

(72) Inventors: Tae Jin Kong, Hwaseong-si (KR); Ock Soo Son, Seoul (KR); Kang Young Lee, Seongnam-si (KR); Xin Xing Li, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 119 days.

(21) Appl. No.: 17/243,200

(22) Filed: Apr. 28, 2021

(65) Prior Publication Data

US 2021/0359081 A1 Nov. 18, 2021

(30) Foreign Application Priority Data

May 12, 2020 (KR) ........................ 10-2020-0056379

(51) Int. Cl.
*H10K 50/854* (2023.01)
*H10K 59/38* (2023.01)
*H10K 59/18* (2023.01)

(52) U.S. Cl.
CPC ........... *H10K 59/18* (2023.02); *H10K 50/854* (2023.02); *H10K 59/38* (2023.02)

(58) Field of Classification Search
CPC ............. H01L 27/3293; H01L 51/5268; H01L 27/322; H01L 27/3244; G02F 1/13336; G02F 1/137; G02F 1/1335; G02F 1/133514; G09G 2300/026; H10K 59/18; H10K 50/854; H10K 59/38; H10K 59/12
See application file for complete search history.

(56) References Cited

U.S. PATENT DOCUMENTS

| 9,111,493 | B2 * | 8/2015 | Watanabe | ............... H05K 7/026 |
| 10,660,220 | B2 * | 5/2020 | Chin | ........................ G02B 6/00 |
| 11,402,869 | B1 * | 8/2022 | Porter | .................. G02B 6/0006 |

(Continued)

FOREIGN PATENT DOCUMENTS

| KR | 2000-0008980 A | 2/2000 |
| KR | 2000-0019765 A | 4/2000 |

(Continued)

*Primary Examiner* — Temesghen Ghebretinsae
*Assistant Examiner* — Karin Kiyabu
(74) *Attorney, Agent, or Firm* — Lewis Roca Rothgerber Christie LLP

(57) ABSTRACT

A tiled display device includes: a first display device including: a first display substrate having a plurality of light emitting areas; and a second color conversion substrate comprising a plurality of light transmitting areas respectively corresponding to the light emitting areas and comprising a light scattering material and a plurality of light blocking areas between the light transmitting areas; a second display device comprising a second display substrate and a second color conversion substrate, the second display device being at a side of the first display device; and a light scattering member between the first display device and the second display device and comprising a light scattering material, wherein an external light reflectance of the light scattering member is higher than an average value of an external light reflectance of the light transmitting areas and an external light reflectance of the light blocking areas.

17 Claims, 23 Drawing Sheets

(56) References Cited

U.S. PATENT DOCUMENTS

| | | | |
|---|---|---|---|
| 2010/0123384 A1* | 5/2010 | Miller | H01L 51/5262 313/498 |
| 2010/0177261 A1* | 7/2010 | Jin | G02F 1/13336 362/97.2 |
| 2010/0238090 A1* | 9/2010 | Pomerantz | G02F 1/133524 345/1.3 |
| 2011/0102300 A1* | 5/2011 | Wood | H04N 9/3147 345/1.3 |
| 2015/0009587 A1* | 1/2015 | Kim | G02B 5/045 359/837 |
| 2015/0286457 A1* | 10/2015 | Kim | G06F 3/1446 345/1.3 |
| 2016/0048047 A1* | 2/2016 | Pyo | G02B 5/3083 359/488.01 |
| 2016/0195774 A1* | 7/2016 | Lee | G02F 1/133617 349/110 |
| 2016/0363291 A1* | 12/2016 | Sun | G02B 5/0278 |
| 2018/0190631 A1* | 7/2018 | Kim | H01L 25/167 |
| 2019/0137815 A1* | 5/2019 | Kim | H01L 27/3265 |
| 2020/0126458 A1* | 4/2020 | Xiao | H01L 27/3288 |
| 2020/0388636 A1* | 12/2020 | Yueh | H01L 27/124 |

FOREIGN PATENT DOCUMENTS

| | | | | | |
|---|---|---|---|---|---|
| KR | 2000-0021827 A | | 4/2000 | | |
| KR | 2000-0026452 A | | 5/2000 | | |
| KR | 2000-0034204 A | | 6/2000 | | |
| KR | 2000-0038527 A | | 7/2000 | | |
| KR | 2000-0052179 A | | 8/2000 | | |
| KR | 2000051212 A | * | 8/2000 | ....... | G02F 1/133308 |
| KR | 10-0345269 B1 | | 10/2003 | | |
| KR | 10-2005-0121533 A | | 12/2005 | | |
| KR | 10-2006-0072737 A | | 6/2006 | | |
| KR | 10-2008-0110083 A | | 12/2008 | | |
| KR | 20130117103 A | * | 10/2013 | | |
| KR | 10-2015-0116218 A | | 10/2015 | | |
| KR | 10-2018-0128550 A | | 12/2018 | | |
| KR | 20180128550 A | * | 12/2018 | | |
| KR | 10-1996970 B1 | | 7/2019 | | |
| KR | 10-2019-0121894 A | | 10/2019 | | |
| KR | 10-2019-0124359 A | | 11/2019 | | |
| KR | 10-2020-0001648 A | | 1/2020 | | |
| KR | 10-2020-0001649 A | | 1/2020 | | |
| KR | 10-2020-0004936 A | | 1/2020 | | |

* cited by examiner

TILED DISPLAY DEVICE

CROSS-REFERENCE TO RELATED APPLICATION

The present application claims priority to and the benefit of Korean Patent Application No. 10-2020-0056379 filed on May 12, 2020, in the Korean Intellectual Property Office, the disclosure of which is incorporated herein by reference in its entirety.

BACKGROUND

1. Field

Aspects of some example embodiments of the present disclosure relate to a tiled display device.

2. Description of the Related Art

As the information society develops, the demand for display devices for displaying images is increasing in various forms. For example, display devices may be incorporated into various electronic devices such as smartphones, digital cameras, notebook computers, navigation devices, and smart televisions. The display devices may be flat panel display devices such as liquid crystal display devices, field emission display devices, and organic light emitting display devices. Of the flat panel display devices, a light emitting display device includes a light emitting element that enables each pixel of a display panel to emit light by itself. Thus, the light emitting display device can display an image without a backlight unit that provides light to the display panel.

When a display device is manufactured to have a relatively large size, a defect rate of light emitting elements may increase due to the relative increase in the number of pixels, and therefore productivity or reliability may be reduced. In an effort to address such issues, a tiled display device may be utilized to provide a large screen by connecting a plurality of relatively small display devices. The tiled display device may include a boundary part called a seam between the display devices due to a non-display area or a bezel area of each of the display devices adjacent to each other. When one image is displayed on the entire screen, the boundary part between the display areas gives a sense of separation to the entire screen, thereby reducing a sense of immersion in the image.

The above information disclosed in this Background section is only for enhancement of understanding of the background and therefore the information discussed in this Background section does not necessarily constitute prior art.

SUMMARY

Aspects of some example embodiments of the present disclosure include a tiled display device which may eliminate or reduce a sense of separation between a plurality of display devices and improve a sense of immersion in images by preventing or reducing the visibility or perceptibility of a boundary part or non-display areas between the display devices.

However, aspects of embodiments according to the present disclosure are not restricted to those specifically described herein. The above and other aspects of embodiments according to the present disclosure will become more apparent to one of ordinary skill in the art to which the present disclosure pertains by referencing the detailed description of the present disclosure given below.

According to some example embodiments of the present disclosure, a tiled display device includes: a first display device which comprises a display substrate having a plurality of light emitting areas and a color conversion substrate comprising a plurality of light transmitting areas arranged to respectively correspond to the light emitting areas and comprising a light scattering material and a plurality of light blocking areas arranged between the light transmitting areas, a second display device which comprises the display substrate and the color conversion substrate and is arranged at a side of the first display device, and a light scattering member which is arranged between the first display device and the second display device and comprises a light scattering material. External light reflectance of the light scattering member is higher than an average value of external light reflectance of the light transmitting areas and external light reflectance of the light blocking areas.

According to some example embodiments, the external light reflectance of the light scattering member may be substantially equal to external light reflectance of the color conversion substrate.

According to some example embodiments, the external light reflectance of the light scattering member may be lower than the external light reflectance of the light transmitting areas and higher than the external light reflectance of the light blocking areas.

According to some example embodiments, the color conversion substrate may comprise: a base member which comprises the light transmitting areas and the light blocking areas, a plurality of color filters which are on the base member, a plurality of wavelength converting units which are on the color filters to correspond to some of the light transmitting areas and comprise the light scattering material, and a light transmitting unit which is arranged on the color filters to correspond to the other one of the light transmitting areas and comprises the light scattering material.

According to some example embodiments, the color filters may comprise: a first color filter which transmits light of a first color and overlaps a first light transmitting area among the light transmitting areas, a second color filter which transmits light of a second color and overlaps a second light transmitting area among the light transmitting areas, and a third color filter which transmits light of a third color and overlaps a third light transmitting area among the light transmitting areas and the light blocking areas.

According to some example embodiments, the wavelength converting units may comprise: a first wavelength converting unit which is arranged on the first color filter and comprises a first wavelength shifter converting a peak wavelength of incident light into a first peak wavelength and the light scattering material, and a second wavelength converting unit which is arranged on the second color filter and comprises a second wavelength shifter converting a peak wavelength of incident light into a second peak wavelength different from the first peak wavelength and the light scattering material.

According to some example embodiments, the first wavelength converting unit or the second wavelength converting unit may be thicker than the light scattering member.

According to some example embodiments, the light transmitting unit may be arranged on the third color filter and transmits incident light while maintaining a peak wavelength of the incident light using the light scattering material.

According to some example embodiments, the light transmitting unit may be thicker than the light scattering member.

According to some example embodiments, the amount of the light scattering material of the light transmitting unit per unit volume may be greater than the amount of the scattering material of the light scattering member per unit volume.

According to some example embodiments, each of the first display device and the second display device may further comprise: a connection pad which is arranged on side surfaces of the display substrate and the color conversion substrate bonded to each other, and a flexible film which is arranged on a surface of the connection pad using an adhesive film.

According to some example embodiments, the light scattering member may cover an upper surface of at least one of the connection pad, the adhesive film, or the flexible film.

According to some example embodiments, the tiled display device may further comprise a light control film which covers the first display device, the second display device, and the light scattering member.

According to some example embodiments, the tiled display device may further comprise a cover module which covers side and lower surfaces of the first display device and the second display device.

According to some example embodiments of the present disclosure, a tiled display device includes: a first display device which comprises a display substrate having a plurality of light emitting areas and a color conversion substrate comprising a plurality of light transmitting areas arranged to respectively correspond to the light emitting areas and comprising a light scattering material and a plurality of light blocking areas arranged between the light transmitting areas, a second display device which comprises the display substrate and the color conversion substrate and is located at a side of the first display device, and a light scattering member which is located between the first display device and the second display device and comprises a light scattering material. External light reflectance of the light scattering member is substantially equal to external light reflectance of the light conversion substrate.

According to some example embodiments, the external light reflectance of the light scattering member may be lower than external light reflectance of the light transmitting areas and higher than external light reflectance of the light blocking areas.

According to some example embodiments, the color conversion substrate may comprise: a base member which comprises the light transmitting areas and the light blocking areas, first to third color filters which are arranged on the base member, a first wavelength converting unit which is located on the first color filter and comprises a first wavelength shifter converting a peak wavelength of incident light into a first peak wavelength and the light scattering material, a second wavelength converting unit which is on the second color filter and comprises a second wavelength shifter converting a peak wavelength of incident light into a second peak wavelength different from the first peak wavelength and the light scattering material, and a light transmitting unit which is on the third color filter and transmits incident light while maintaining a peak wavelength of the incident light using the light scattering material.

According to some example embodiments, the first wavelength converting unit, the second wavelength converting unit, or the light transmitting unit may be thicker than the light scattering member.

According to some example embodiments, the amount of the light scattering material of the light transmitting unit per unit volume may be greater than the amount of the scattering material of the light scattering member per unit volume.

According to some example embodiments, each of the first display device and the second display device may further comprise: a connection pad on side surfaces of the display substrate and the color conversion substrate bonded to each other, and a flexible film on a surface of the connection pad using an adhesive film. The light scattering member covers an upper surface of at least one of the connection pad, the adhesive film, or the flexible film.

BRIEF DESCRIPTION OF THE DRAWINGS

These and/or other aspects will become more apparent and more readily appreciated from the following description of the example embodiments, taken in conjunction with the accompanying drawings in which.

DETAILED DESCRIPTION

Figure 1:
FIG. 1 is a plan view of a tiled display device according to some example embodiments.

In the following description, for the purposes of explanation, numerous specific details are set forth in order to provide a thorough understanding of various example embodiments or implementations of the invention. As used herein "embodiments" and "implementations" are interchangeable words that are non-limiting examples of devices or methods employing one or more of the inventive concepts disclosed herein. It is apparent, however, that various example embodiments may be practiced without these specific details or with one or more equivalent arrangements. In other instances, well-known structures and devices are shown in block diagram form in order to avoid unnecessarily obscuring various example embodiments. Further, various example embodiments may be different, but do not have to be exclusive. For example, specific shapes, configurations, and characteristics of an example embodiment may be used or implemented in another example embodiment without departing from the spirit and scope of embodiments according to the inventive concepts.

Unless otherwise specified, the illustrated example embodiments are to be understood as providing example features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an example embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the example term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various example embodiments are described herein with reference to sectional and/or exploded illustrations that are schematic illustrations of idealized example embodiments and/or intermediate structures. As such, variations from the shapes of the illustrations as a result, for example, of manufacturing techniques and/or tolerances, are to be expected. Thus, example embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some example embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some example embodiments may be physically separated into two or more interacting and discrete blocks, units, and/or modules without departing from the scope of the inventive concepts. Further, the blocks, units, and/or modules of some example embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a plan view of a tiled display device TD according to some example embodiments.

Referring to FIG. 1, the tiled display device TD may include a plurality of display devices 10. The display devices 10 may be arranged in a lattice shape or matrix configuration, but embodiments according to the present disclosure are not limited thereto. The display devices 10 may be connected to each other in a first direction (X-axis direction) and a second direction (Y-axis direction), and the tiled display device TD may have a specific shape. For example, the display devices 10 may have the same size, but embodiments according to the present disclosure are not limited thereto. For example, according to some example embodiments, one or more of the display devices 10 may have different sizes from other ones of the display devices 10.

Each of the display devices 10 may be shaped like a rectangle including long sides and short sides. The long sides or short sides of the display devices 10 may be connected to each other. Some of the display devices 10 may be arranged at an edge of the tiled display device TD to form a side of the tiled display device TD. Some of the display devices 10 may be arranged at corners of the tiled display device TD and may form two adjacent sides of the tiled display device TD. The other ones of the display devices 10 may be arranged inside the tiled display device TD and surrounded by other display devices 10.

Each of the display devices 10 may include a display area DA and a non-display area NDA. The display area DA may include a plurality of pixels to display an image. The non-display area NDA may be arranged around the display area DA to surround the display area DA and may not display an image.

The overall shape of the tiled display device TD may be a planar shape, but embodiments according to the present disclosure are not limited thereto. The tiled display device TD may also have a three-dimensional (3D) shape to provide a 3D effect to a user. For example, when the tiled display device TD has a 3D shape, at least some of the display devices 10 may have a curved shape. For another example, the display devices 10 may each have a planar shape but may be connected to each other at a predetermined angle, so that the tiled display device TD can have a 3D shape.

The tiled display device TD may be formed by connecting the respective non-display areas NDA of adjacent display devices 10. The display devices 10 may be connected to each other through a connection member or an adhesive member. Therefore, the non-display areas NDA between the display devices 10 may be surrounded by adjacent display areas DA. External light reflectance of the display area DA of each of the display devices 10 and external light reflectance of the non-display areas NDA between the display devices 10 may be equal or substantially equal. Here, when the external light reflectance of the display area DA and the external light reflectance of the non-display areas NDA are substantially equal, it means that the non-display areas NDA between the display devices 10 or a boundary part between the display devices 10 is not perceived by a user. Therefore, the tiled display device TD may eliminate or reduce a sense of separation between the display devices 10 and improve a sense of immersion in images by preventing or reducing visibility or perceptibility of the non-display areas NDA or the boundary part between the display devices 10.

Figure 2:
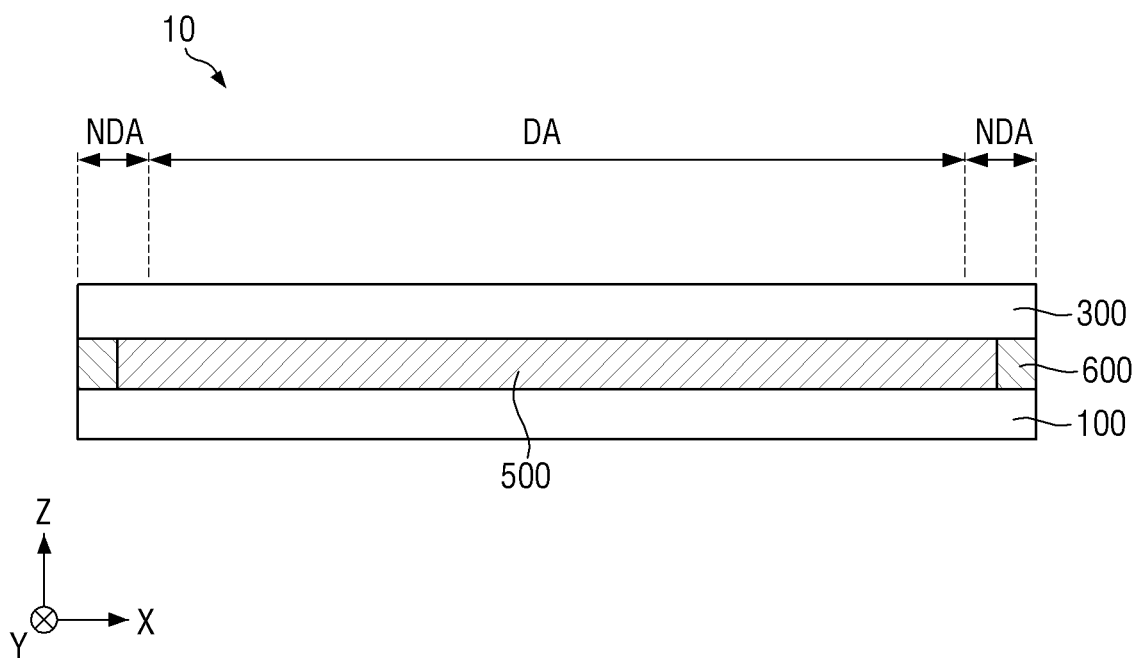
FIG. 2 is a cross-sectional view of a display device of the tiled display device according to some example embodiments.

FIG. 2 is a cross-sectional view of a display device 10 of the tiled display device TD according to some example embodiments.

Referring to FIG. 2, the display device 10 may include a display substrate 100, a color conversion substrate 300, a filler 500, and a sealing member 600.

The display substrate 100 may emit light having a predetermined peak wavelength from a plurality of light emitting areas of the display area DA. The display substrate 100 may include elements and circuits for displaying an image. For example, the display substrate 100 may include pixel circuits such as switching elements, a pixel defining layer defining the light emitting areas of the display area DA, and self-light emitting elements.

Examples of the self-light emitting elements may include organic light emitting diodes, quantum dot light emitting diodes, and inorganic material-based light emitting diodes. The inorganic material-based light emitting diodes may have a micrometer or nanometer size. A case where the self-light emitting elements are organic light emitting diodes will hereinafter be described as an example.

The color conversion substrate 300 may be arranged on the display substrate 100 and may face the display substrate 100. The color conversion substrate 300 may include a plurality of light transmitting areas corresponding to the light emitting areas of the display substrate 100. The color conversion substrate 300 may convert a peak wavelength of light emitted from the light emitting areas of the display substrate 100 and transmit the light with the converted peak wavelength or may maintain the peak wavelength of the light emitted from the light emitting areas of the display substrate 100 and transmit the light with the maintained peak wavelength. For example, the display substrate 100 may emit light having a predetermined peak wavelength, and the color conversion substrate 300 may transmit at least two or more beams of light having different peak wavelengths.

The filler 500 may be located in a space between the display substrate 100 and the color conversion substrate 300 and may be surrounded by the sealing member 600. The filler 500 may fill the space between the display substrate 100 and the color conversion substrate 300. For example, the filler 500 may be made of an organic material and may transmit light. The filler 500 may be made of, but is not necessarily limited to, a silicon-based organic material or an epoxy-based organic material. For another example, the filler 500 may be omitted.

The sealing member 600 may be located between edges of the display substrate 100 and edges of the color conversion substrate 300 in the non-display area NDA. The sealing member 600 may be arranged along the edges of the display substrate 100 and the color conversion substrate 300 in the non-display area NDA to seal the filler 500. The display substrate 100 and the color conversion substrate 300 may be bonded to each other through the sealing member 600. For example, the sealing member 600 may include an organic material. The sealing member 600 may be made of, but not necessarily limited to, epoxy-based resin.

Figure 3:
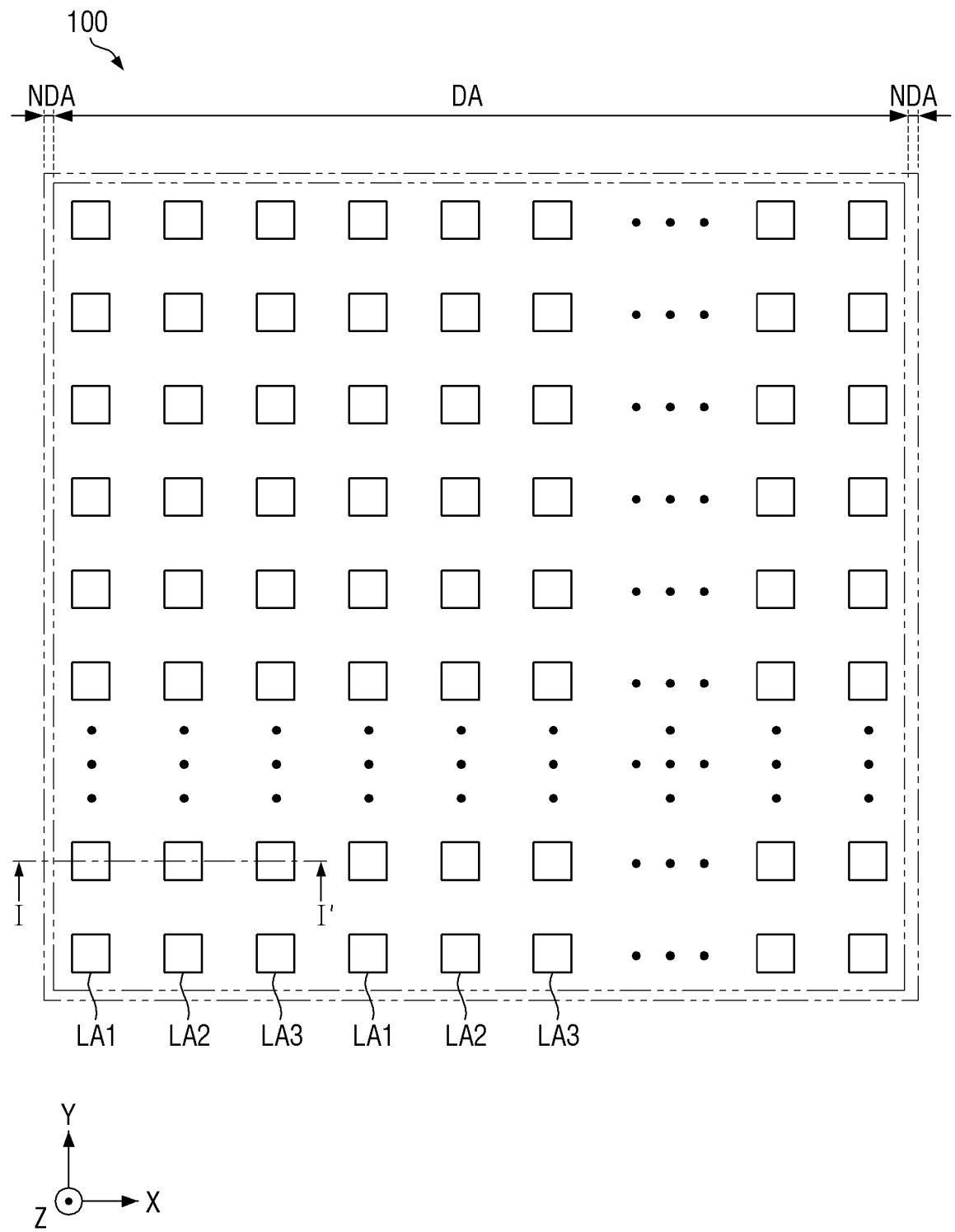
FIG. 3 is a plan view of a surface of a display substrate of the display device according to some example embodiments.

FIG. 3 is a plan view of a surface of the display substrate 100 of the display device 10 according to some example embodiments. Here, the surface of the display substrate 100 may be a front surface or an upper surface of the display substrate 100.

Referring to FIG. 3, the display substrate 100 may include a plurality of pixels arranged along a plurality of rows and a plurality of columns in the display area DA. Each of the pixels may include a light emitting area defined by the pixel defining layer and may emit light having a predetermined peak wavelength through the light emitting area. For example, the display area DA of the display substrate 100 may include first through third light emitting areas LA1 through LA3. Each of the first through third light emitting areas LA1 through LA3 may be an area where light generated by a light emitting element of the display substrate 100 is emitted to the outside of the display substrate 100.

The first through third light emitting areas LA1 through LA3 may emit light having a predetermined peak wavelength to the outside of the display substrate 100. For example, the first through third light emitting areas LA1 through LA3 may emit blue light. Light emitted from the first through third light emitting areas LA1 through LA3 may have a peak wavelength of 440 to 480 nanometers (nm).

The first through third light emitting areas LA1 through LA3 may be sequentially and repeatedly arranged along the first direction (X-axis direction) of the display area DA. For example, a width of the first light emitting area LA1 in the first direction (X-axis direction) may be greater than a width of the second light emitting area LA2 in the first direction, and the width of the second light emitting area LA2 in the first direction may be greater than a width of the third light emitting area LA3 in the first direction. The width of each of the first through third light emitting areas LA1 through LA3 is not limited to the embodiment illustrated in FIG. 3. For another example, the width of the first light emitting area LA1 in the first direction (X-axis direction), the width of the second light emitting area LA2 in the first direction, and the width of the third light emitting area LA3 in the first direction may be substantially equal.

For example, the area of the first light emitting area LA1 may be larger than the area of the second light emitting area LA2, and the area of the second light emitting area LA2 may be larger than the area of the third light emitting area LA3. The area of each of the first through third light emitting areas LA1 through LA3 is not limited to the embodiment illustrated in FIG. 3. For another example, the area of the first light emitting area LA1, the area of the second light emitting area LA2, and the area of the third light emitting area LA3 may be substantially equal.

Figure 4:
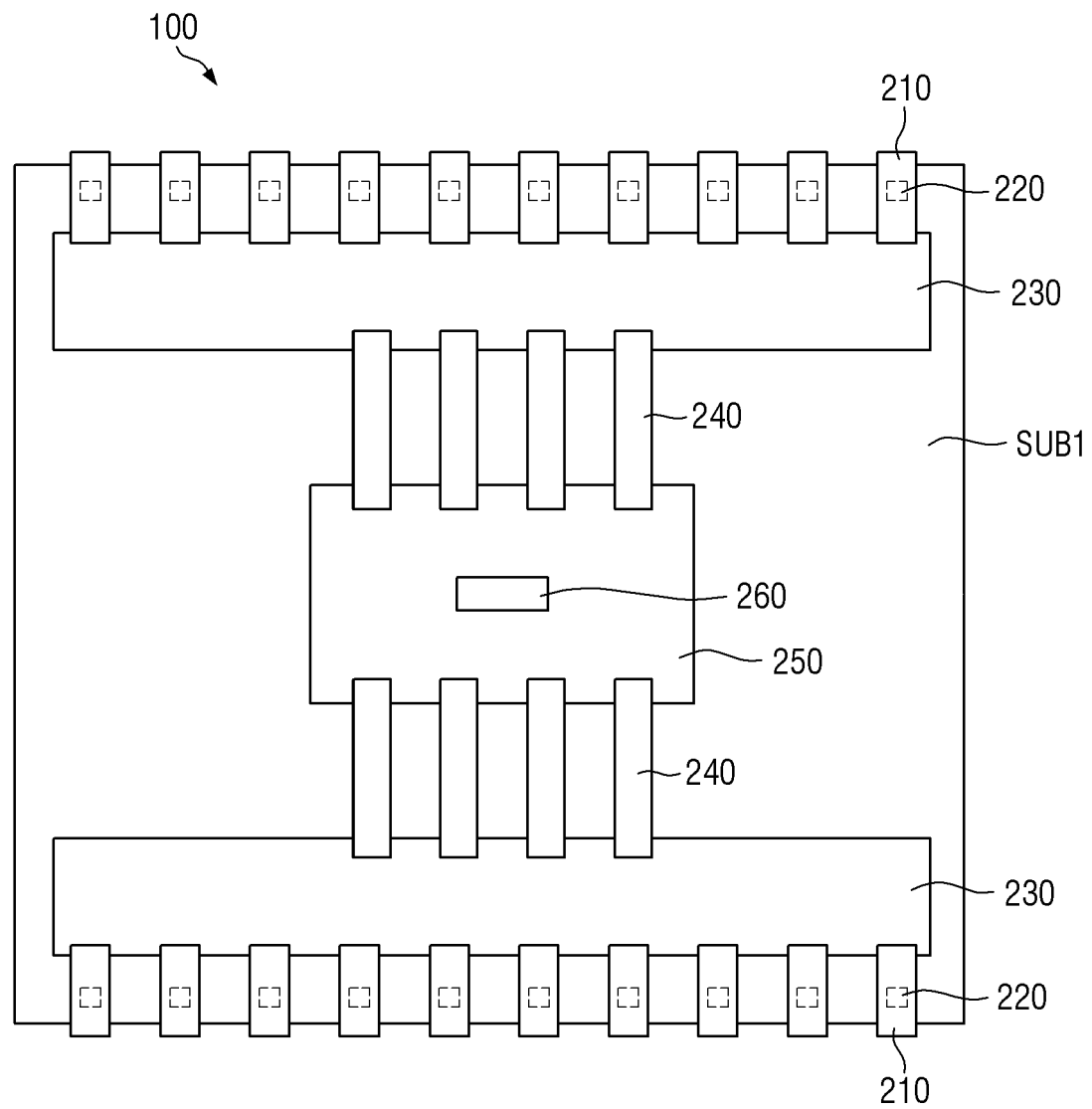
FIG. 4 is a plan view of the other surface of the display substrate of the display device according to some example embodiments.

FIG. 4 is a plan view of the other surface of the display substrate 100 of the display device 10 according to some example embodiments. Here, the other surface of the display substrate 100 may be a back surface or a lower surface of the display substrate 100.

Referring to FIG. 4, the display substrate 100 may include a first base member SUB1.

The first base member SUB1 may be a base substrate and may be made of an insulating material such as polymer resin. For example, the first base member SUB1 may be a rigid substrate. For another example, the first base member SUB1 may be a flexible substrate that can be bent, folded, and rolled. When the first base member SUB1 is a flexible substrate, it may be made of polyimide (PI), but the present disclosure is not necessarily limited thereto.

The display device 10 may include a plurality of flexible films 210, a plurality of source drivers 220, source circuit boards 230, a plurality of cables 240, a control circuit board 250, and a timing controller 260.

Each of the flexible films 210 may be arranged on an upper side or a lower side of the display substrate 100. The flexible films 210 may extend from side surfaces of the display device 10 to the lower surface of the display substrate 100. For example, the flexible films 210 may be arranged on side surfaces of the display substrate 100 and the color conversion substrate 300 through side bonding. A side of each flexible film 210 may be connected to a connection wiring of the display substrate 100 on a side surface of the display substrate 100, and the other side of each flexible film 210 may be connected to a source circuit board 230 on the lower surface of the display substrate 100. For example, the flexible films 210 may be anisotropic conductive films and may transmit signals of the source drivers 220 or the source circuit boards 230 to the display substrate 100.

The source drivers 220 may be located on respective surfaces of the flexible films 210, respectively. For example, the source drivers 220 may be integrated circuits. The source drivers 220 may convert digital video data into analog data voltages based on a source control signal of the timing controller 260 and supply the analog data voltages to data lines of the display substrate 100 through the flexible films 210.

Each of the source circuit boards 230 may be located between the flexible films 210 and the cables 240. Each of the source circuit boards 230 may be connected to the source drivers 220 or the display substrate 100 through the flexible films 210 and may be connected to the control circuit board 250 or the timing controller 260 through the cables 240. For example, the source circuit boards 230 may be flexible printed circuit boards or a printed circuit boards. The cables 240 may be, but are not limited to, flexible cables.

The control circuit board 250 may be connected to the source circuit boards 230 through the cables 240. For example, the control circuit board 250 may be a flexible printed circuit board or a printed circuit board.

The timing controller 260 may be located on a surface of the control circuit board 250. For example, the timing controller 260 may be an integrated circuit. The timing controller 260 may receive digital video data and timing signals from a system on chip of a system circuit board. The timing controller 260 may generate the source control signal based on the timing signals and control the driving timings of the source drivers 220 using the source control signal. The timing controller 260 may generate a scan control signal based on the timing signals and control the driving timing of a scan driver using the scan control signal.

The display device 10 may further include a power supply unit (or power supply) located on or connected to the control circuit board 250. The power supply unit may generate voltages necessary for driving the display substrate 100 from main power received from the system circuit board and supply the generated voltages to the display substrate 100. For example, the power supply unit may generate driving voltages for driving the source drivers 220, the timing controller 260, and the scan driver.

Figure 5:
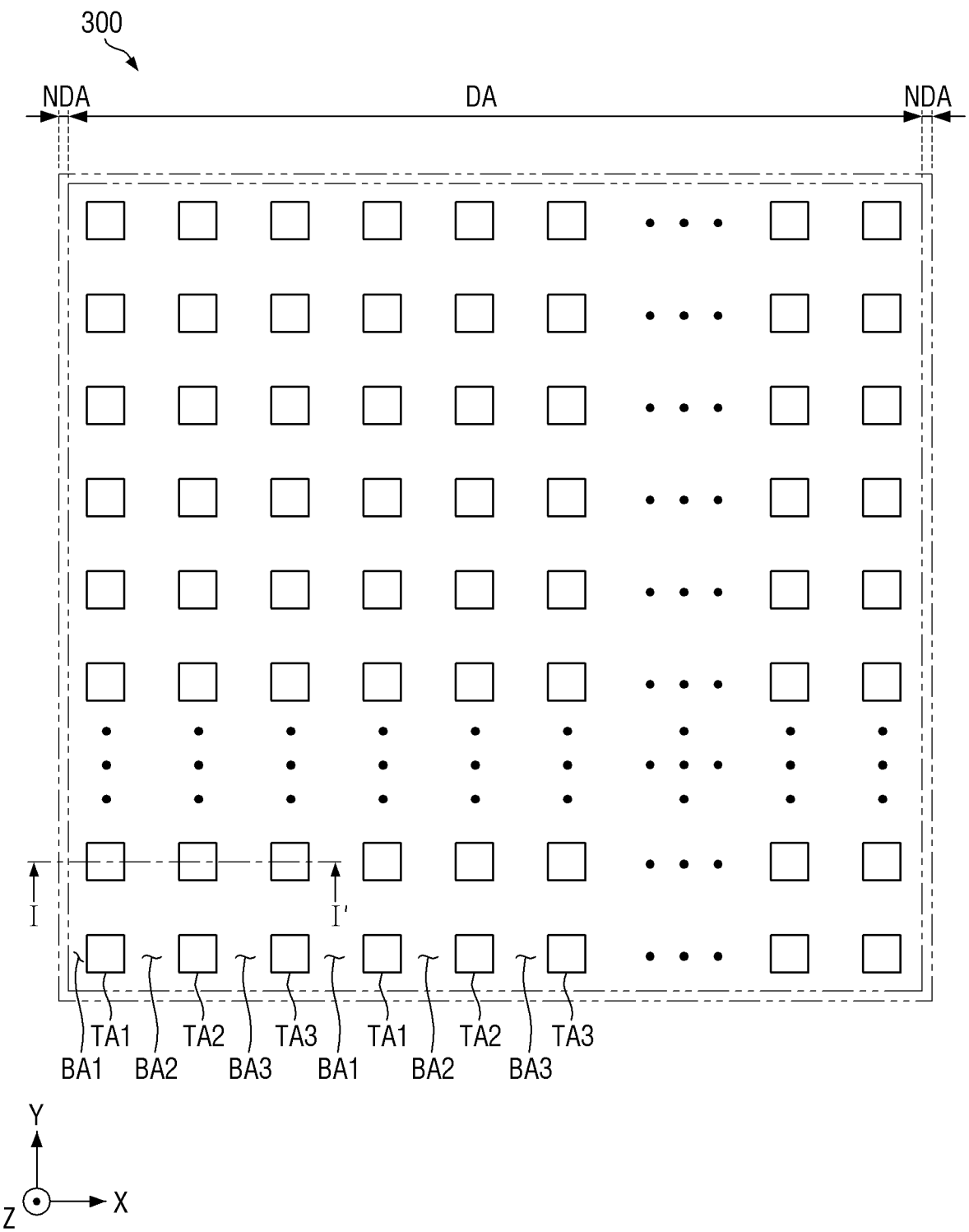
FIG. 5 is a plan view of a color conversion substrate of the display device according to some example embodiments.

FIG. 5 is a plan view of the color conversion substrate 300 of the display device 10 according to some example embodiments.

Referring to FIG. 5, the color conversion substrate 300 may be arranged on the display substrate 100 and may face the display substrate 100. The color conversion substrate 300 may include a plurality of light transmitting areas corresponding to the light emitting areas of the display substrate 100 and a plurality of light blocking areas surrounding the light transmitting areas. For example, the color conversion substrate 300 may include first through third light transmitting areas TA1 through TA3 and first through third light blocking areas BA1 through BA3. The first through third light transmitting areas TA1 through TA3 may correspond to the first through third light emitting areas LA1 through LA3 of the display substrate 100, respectively. The first through third light blocking areas BA1 through BA3 may be located on respective sides of the first through third light transmitting areas TA1 through TA3, respectively, and may prevent or reduce color mixing of light emitted from the first through third light transmitting areas TA1 through TA3.

The color conversion substrate 300 may convert a peak wavelength of light emitted from the light emitting areas of the display substrate 100 and transmit the light with the converted peak wavelength or may maintain the peak wavelength of the light emitted from the light emitting areas of the display substrate 100 and transmit the light with the maintained peak wavelength. For example, the first light transmitting area TA1 may convert a peak wavelength of light output from the display substrate 100 and emit light of a first color. The second light transmitting area TA2 may convert the peak wavelength of the light output from the display substrate 100 and emit light of a second color different from the first color. The third light transmitting area TA3 may maintain the peak wavelength of the light output from the display substrate 100 and emit light of a third color different from the first color and the second color. For example, the light of the first color may be red light having a peak wavelength of 610 to 650 nm, the light of the second color may be green light having a peak wavelength of 510 to 550 nm, and the light of the third color may be blue light having a peak wavelength of 440 to 480 nm.

The first through third light transmitting areas TA1 through TA3 may be sequentially and repeatedly arranged along the first direction (X-axis direction) of the display area DA. For example, a width of the first light transmitting area TA1 in the first direction (X-axis direction) may be greater than a width of the second light transmitting area TA2 in the first direction, and the width of the second light transmitting area TA2 in the first direction may be greater than a width of the third light transmitting area TA3 in the first direction. The width of each of the first through third light transmitting areas TA1 through TA3 is not limited to the embodiment illustrated in FIG. 5. For another example, the width of the first light transmitting area TA1 in the first direction (X-axis direction), the width of the second light transmitting area TA2 in the first direction, and the width of the third light transmitting area TA3 in the first direction may be substantially equal.

For example, the area of the first light transmitting area TA1 may be larger than the area of the second light transmitting area TA2, and the area of the second light transmitting area TA2 may be larger than the area of the third light transmitting area TA3. The area of each of the first through third light transmitting areas TA1 through TA3 is not limited to the embodiment illustrated in FIG. 5. For another example, the area of the first light transmitting area TA1, the area of the second light transmitting area TA2, and the area of the third light transmitting area TA3 may be substantially equal.

Figure 6:
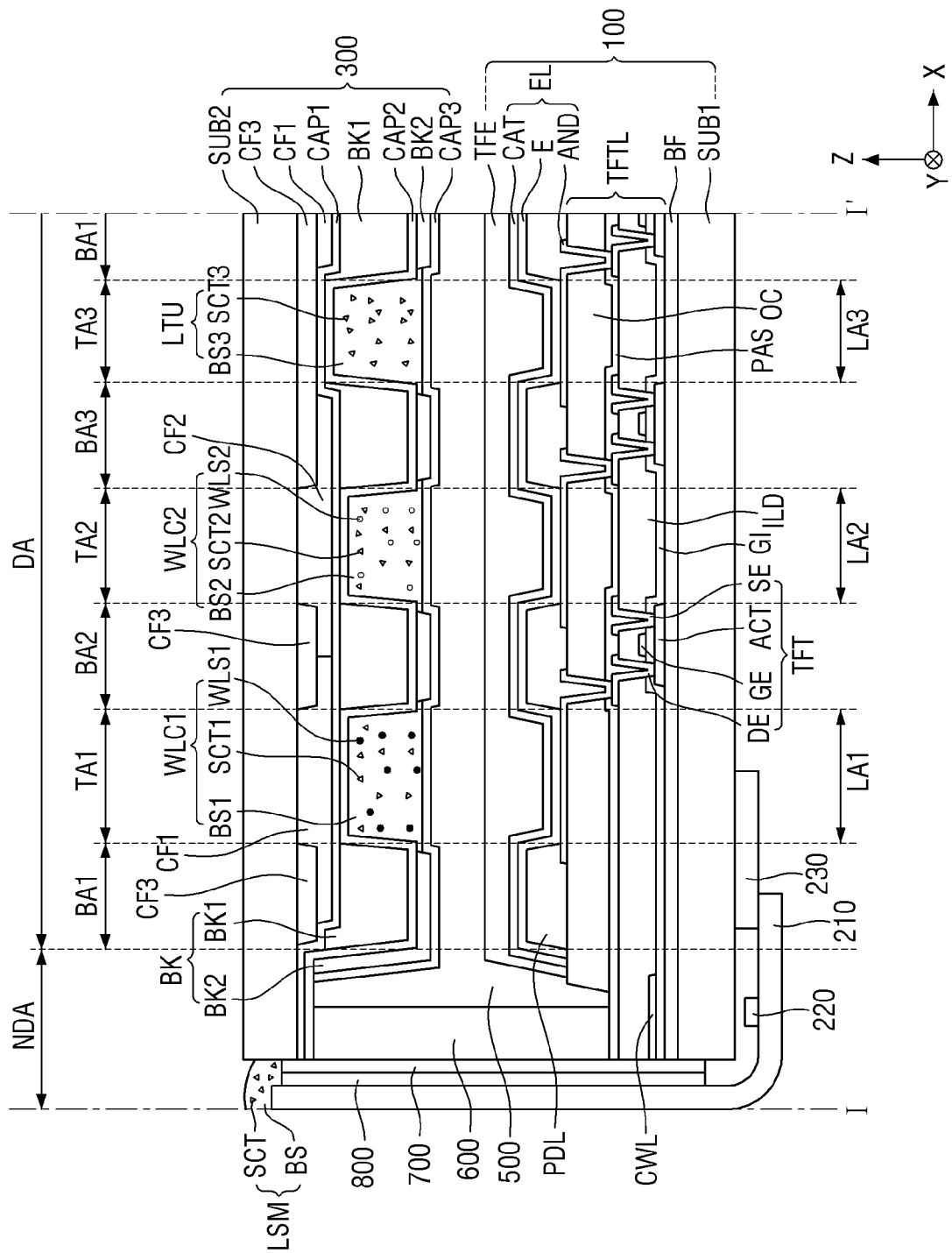
FIG. 6 is a cross-sectional view taken along the line I-I' of FIGS. 3 and 5.

FIG. 6 is a cross-sectional view taken along the line I-I' of FIGS. 3 and 5.

Referring to FIG. 6, the display area DA of the display substrate 100 may include the first through third light emitting areas LA1 through LA3. Each of the first through third light emitting areas LA1 through LA3 may be an area where light generated by a light emitting element of the display substrate 100 is emitted to the outside of the display substrate 100.

The display substrate 100 may include the first base member SUB1, a buffer layer BF, a thin-film transistor layer TFTL, light emitting elements EL, and an encapsulation layer TFE.

The first base member SUB1 may be a base substrate and may be made of an insulating material such as polymer resin. For example, the first base member SUB1 may be a rigid substrate. For another example, the first base member SUB1 may be a flexible substrate that can be bent, folded, and rolled. When the first base member SUB1 is a flexible substrate, it may be made of polyimide (PI), but the present disclosure is not necessarily limited thereto.

The buffer layer BF may be located on the first base member SUB1. The buffer layer BF may be an inorganic layer that can prevent or reduce the introduction of air or moisture or other contaminants. For example, the buffer layer BF may include a plurality of inorganic layers stacked alternately. The buffer layer BF may be a multilayer in which one or more inorganic layers selected from a silicon nitride layer, a silicon oxynitride layer, a silicon oxide layer, a titanium oxide layer, and an aluminum oxide layer are alternately stacked, but the present disclosure is not necessarily limited thereto.

The thin-film transistor layer TFTL may include thin-film transistors TFT, a gate insulating layer GI, a connection wiring CWL, an interlayer insulating film ILD, a passivation layer PAS, and a planarization layer OC.

The thin-film transistors TFT may be located on the buffer layer BF to form respective pixel circuits of a plurality of pixels. For example, the thin-film transistors TFT may be driving transistors or switching transistors of the pixel circuits. Each of the thin-film transistors TFT may include a semiconductor layer ACT, a gate electrode GE, a source electrode SE, and a drain electrode DE.

The semiconductor layer ACT may be provided on the buffer layer BF. The semiconductor layer ACT may be overlapped by the gate electrode GE, the source electrode SE, and the drain electrode DE. The semiconductor layer ACT may directly contact the source electrode SE and the drain electrode DE and may face the gate electrode GE with the gate insulating layer GI interposed between them.

The gate electrode GE may be located on the gate insulating layer GI. The gate electrode GE may overlap the semiconductor layer ACT with the gate insulating layer GI interposed between them.

The source electrode SE and the drain electrode DE may be located on the interlayer insulating film ILD and spaced apart from each other. The source electrode SE may contact an end of the semiconductor layer ACT through a contact hole provided in the gate insulating layer GI and the interlayer insulting film ILD. The drain electrode DE may contact the other end of the semiconductor layer ACT through a contact hole provided in the gate insulating layer GI and the interlayer insulating film ILD. The drain electrode DE may be connected to a first electrode AND of each light emitting element EL through a contact hole provided in the passivation layer PAS and the planarization layer OC.

The gate insulating layer GI may be provided on the semiconductor layers ACT. For example, the gate insulating layer GI may be located on the semiconductor layers ACT and the buffer layer BF and may insulate the semiconductor layers ACT from the gate electrodes GE. The gate insulating layer GI may include contact holes through which the source electrodes SE pass and contact holes through which the drain electrodes DE pass.

The connection wiring CWL may be located on the gate insulating layer GI on the periphery of the display substrate 100. The connection wiring CWL may be electrically connected to a connection pad 700 located on a side surface of the display device 10 and may be connected to a plurality of data lines or a plurality of scan lines. The connection wiring CWL may be connected to the data lines to provide data voltages or may be connected to the scan lines to provide scan signals. In FIG. 6, the connection wiring CWL may be formed on the same layer and of the same material as the gate electrodes GE of the thin-film transistors TFT, but the present disclosure is not necessarily limited thereto. For another example, the connection wiring CWL may be formed on the same layer and of the same material as the source electrodes SE or the drain electrodes DE of the thin-film transistors TFT.

The interlayer insulating film ILD may be located on the gate electrodes GE. For example, the interlayer insulating film ILD may include contact holes through which the source electrodes SE pass and contact holes through which the drain electrodes DE pass. Here, the contact holes of the interlayer insulating film ILD may be connected to the contact holes of the gate insulating layer GI.

The passivation layer PAS may be provided on the thin-film transistors TFT to protect the thin-film transistors TFT. For example, the passivation layer PAS may include contact holes through which the first electrodes AND pass.

The planarization layer OC may be provided on the passivation layer PAS to planarize the top of the thin-film transistors TFT. For example, the planarization layer OC may include contact holes through which the first electrodes AND of the light emitting elements EL pass. Here, the contact holes of the planarization layer OC may be connected to the contact holes of the passivation layer PAS.

The light emitting elements EL may be provided on the thin-film transistors TFT. Each of the light emitting elements EL may include the first electrode AND, a light emitting layer E, and a second electrode CAT.

The first electrode AND may be provided on the planarization layer OC. For example, the first electrode AND may be arranged to overlap one of the first through third light emitting areas LA1 through LA3 defined by a pixel defining layer PDL. In addition, the first electrode AND may be connected to the drain electrode DE of each thin-film transistor TFT.

The light emitting layer E may be provided on the first electrode AND. The light emitting layer E may include a hole injection layer, a hole transport layer, a light receiving layer, an electron blocking layer, an electron transport layer, an electron injection layer, etc. For example, the light emitting layer E may be an organic light emitting layer made of an organic material, but the present disclosure is not necessarily limited thereto. When the light emitting layer E is an organic light emitting layer, a thin-film transistor TFT may apply a predetermined voltage to the first electrode AND of a light emitting element EL, and the second electrode CAT of the light emitting element EL may receive a common voltage or a cathode voltage. In addition, holes and electrons may move to the organic light emitting layer E respectively through the hole transport layer and the electron transport layer and combine in the organic light emitting layer E to emit light.

The second electrode CAT may be provided on the light emitting layer E. For example, the second electrode CAT may be implemented as an electrode common to all pixels without distinction between the pixels.

For another example, each light emitting element EL may include an inorganic material-based light emitting diode. In this case, each light emitting element EL may have a micrometer or nanometer size and include an inorganic light emitting diode. The inorganic light emitting diode may be aligned between two electrodes facing each other according to an electric field formed in a specific field between the two electrodes. The inorganic light emitting diode may extend in one direction. The inorganic light emitting diode may be shaped like a rod, a wire, a tube, or the like. The inorganic light emitting diode may be shaped like a cylinder or a rod. Alternatively, the inorganic light emitting diode may have various shapes including polygonal prisms, such as a cube, a rectangular parallelepiped and a hexagonal prism, and a shape extending in a direction and partially inclined. A plurality of semiconductors of the inorganic light emitting diode may be sequentially arranged or stacked along one direction. The inorganic light emitting diode may include a first semiconductor layer, a second semiconductor layer, an active layer, an electrode layer, and an insulating layer.

The pixel defining layer PDL may define the first through third light emitting areas LA1 through LA3. The pixel defining layer PDL may separate and insulate the respective first electrodes AND of the light emitting elements EL from each other.

The encapsulation layer TFE may be arranged on the second electrode CAT to cover the light emitting elements EL. The encapsulation layer TFE may prevent or reduce instances of oxygen, moisture, or other contaminants penetrating into the light emitting elements EL.

The color conversion substrate 300 may be located on the display substrate 100 and may face the display substrate 100. The color conversion substrate 300 may include the first through third light transmitting areas TA1 through TA3 and the first through third light blocking area BA1 through BA3. The first through third light transmitting areas TA1 through TA3 may correspond to the first through third light emitting areas LA1 through LA3 of the display substrate 100, respectively. The first through third light blocking areas BA1 through BA3 may be located on respective sides of the first through third light transmitting areas TA1 through TA3, respectively, and may prevent or reduce color mixing of light emitted from the first through third light transmitting areas TA1 through TA3.

The color conversion substrate 300 may include a second base member SUB2, first through third color filters CF1 through CF3, a first capping layer CAP1, a first blocking member BK1, a second capping layer CAP2, a second light blocking member BK2, first and second wavelength converting units (or first and second wavelength converters) WLC1 and WLC2, a light transmitting unit (or light transmitter) LTU, and a third capping layer CAP3.

The second base member SUB2 may be a base substrate and may be made of an insulating material such as polymer resin. The second base member SUB2 may include a light transmitting material to transmit light emitted from the first through third light transmitting areas TA1 through TA3. For example, the second base member SUB2 may be a rigid substrate. For another example, the second base member SUB2 may be a flexible substrate that can be bent, folded, and rolled. When the second base member SUB2 is a flexible substrate, it may be made of polyimide (PI), but the present disclosure is not necessarily limited thereto.

Optionally, a separate buffer layer may be located on the second base member SUB2 to prevent or reduce the introduction of impurities or contaminants into a surface of the second base member SUB2. In this case, the first through third color filters CF1 through CF3 may directly contact the buffer layer.

The first color filter CF1 may be located on the second base member SUB2 and may overlap the first light transmitting area TA1. The first color filter CF1 may transmit only light of the first color (e.g., red light) and block or absorb light of the second color (e.g., green light) and light of the third color (e.g., blue light). For example, the first color filter CF1 may be a red color filter and may include a red colorant. The red colorant may be made of red dye or red pigment.

The second color filter CF2 may be located on the second base member SUB2 and may overlap the second light transmitting area TA2. The second color filter CF2 may transmit only light of the second color (e.g., green light) and block or absorb light of the first color (e.g., red light) and light of the third color (e.g., blue light). For example, the second color filter CF2 may be a green color filter and may include a green colorant. The green colorant may be made of green dye or green pigment.

The third color filter CF3 may be located on the second base member SUB2 and may overlap the third light transmitting area TA3. In addition, the third color filter CF3 may overlap the first through third light blocking areas BA1 through BA3. The third color filter CF3 may overlap the first color filter CF1 or the second color filter CF2 in each of the first through third light blocking areas BA1 through BA3, thereby preventing or reducing color mixing of light emitted from the first through third light transmitting areas TA1 through TA3. The third color filter CF3 may transmit only light of the third color (e.g., blue light) and block or absorb light of the first color (e.g., red light) and light of the second color (e.g., green light). For example, the third color filter CF3 may be a blue color filter and may include a blue colorant. The blue colorant may be made of blue dye or blue pigment.

When the third color filter CF3 includes the blue colorant, external light or reflected light that has passed through the third color filter CF3 may have a blue wavelength band. A user's eye color sensitivity may vary according to the color of light. For example, light of the blue wavelength band may be perceived less sensitively by a user than light of a green wavelength band and light of a red wavelength band. Therefore, because the third color filter CF includes the blue colorant, a user may perceive reflected light relatively less sensitively.

The first through third color filters CF1 through CF3 may absorb a portion of light introduced from the outside of the display device 10 into the color conversion substrate 300, thereby reducing reflected light due to the external light. Therefore, the first through third color filters CF1 through CF3 may prevent or reduce color distortion due to reflection of external light.

The first capping layer CAP1 may cover the first through third color filters CF1 through CF3 in the display area DA and cover the second base member SUB2 in the non-display area NDA. The first capping layer CAP1 may prevent damage or contamination of the first through third color filters CF1 through CF3 by preventing or reducing penetration of impurities such as moisture or air or other contaminants from the outside. The first capping layer CAP1 may prevent or reduce instances of the colorants included in the first through third color filters CF1 through CF3 being diffused to the first and second wavelength converting units WLC1 and WLC2 or the light transmitting unit LTU.

The first capping layer CAP1 may include an inorganic material. For example, the first capping layer CAP1 may include at least one of silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride.

A plurality of light blocking members BK may overlap the first through light blocking areas BA1 through BA3, respectively, and may be located on the first through third color filters CF1 through CF3. The light blocking members BK may block transmission of light. For example, the light blocking members BK may prevent or reduce color mixing by preventing or reducing the intrusion of light between the first through third light transmitting areas TA1 through TA3, thereby improving a color gamut. The light blocking members BK may be arranged in a lattice shape surrounding the first through third light transmitting areas TA1 through TA3 in a plan view. The light blocking members BK may include the first and second light blocking members BK1 and BK2.

The first light blocking member BK1 may be located on the first through third color filters CF1 through CF3. For example, the first light blocking member BK1 may be directly arranged on the first capping layer CAP1 located on the first through third color filters CF1 through CF3. The first light blocking member BK1 may include an organic light blocking material. For example, the first light blocking member BK1 may include a black organic material. The first light blocking member BK1 may be formed by coating and exposing an organic light blocking material.

The second capping layer CAP2 may cover the first capping layer CAP1 in the first through third light transmitting areas TA1 through TA3 and the non-display area and may cover the first light blocking member BK1 in the first through third light light blocking areas BA1 through BA3. The second capping layer CAP2 may be additionally stacked on the first capping layer CAP1 to doubly prevent or reduce damage or contamination of the first through third color filters CF1 through CF3. The second capping layer CAP2 may prevent or reduce instances of the colorants included in the first through third color filters CF1 through CF3 being diffused to the first and second wavelength converting units WLC1 and WLC2 or the light transmitting unit LTU.

The second capping layer CAP2 may include an inorganic material. The second capping layer CAP2 may be made of the same material as or a different material from the first capping layer CAP1. For example, the second capping layer CAP2 may include at least one of silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride.

The second light blocking member BK2 may be located on the first light blocking member BK1. For example, the second light blocking member BK2 may be located on the second capping layer CAP2 in the first through third light blocking areas BA1 through BA3. For example, the second capping layer CAP2 may cover an upper surface and both side surfaces of the first light blocking member BK1, and the second light blocking member BK2 may be directly arranged on the second capping layer CAP2 covering the upper surface of the first light blocking member BK1.

The second light blocking member BK2 may include an organic light blocking material and a liquid repellent component. Here, the liquid repellent component may be made of fluorine-containing monomers or fluorine-containing polymers, specifically, may include fluorine-containing aliphatic polycarbonate. For example, the second light blocking member BK2 may be made of a black organic material including the liquid repellent component. The second light blocking member BK2 may be formed by coating and exposing an organic light blocking material including the liquid repellent component.

The second light blocking member BK2 including the liquid repellent component may isolate the first and second wavelength converting units WLC1 and WLC2 and the light transmitting unit LTU in corresponding light transmitting areas. For example, when the first and second wavelength converting units WLC1 and WLC2 and the light transmitting unit LTU are formed using an inkjet method, an ink composition may flow on an upper surface of the second light blocking member BK2. In this case, the second light blocking member BK2 including the liquid repellant component may induce the ink composition to flow to each light transmitting area. Therefore, the second light blocking member BK2 may prevent or reduce mixing of the ink composition.

Therefore, in a process of bonding the display substrate 100 and the color conversion substrate 300 together, the display device 10 may maintain thicknesses of the first and second wavelength converting units WLC1 and WLC2 and the light transmitting unit LTU uniform and maintain a thickness of the filler 500 filling the space between the display substrate 100 and the color conversion substrate 300 uniform. Therefore, the display device 10 can prevent or reduce the occurrence of bonding defects and stains.

The first wavelength converting unit WLC1 may be located on the first color filter CF1 to overlap the first light transmitting area TA1. The first wavelength converting unit WLC1 may be surrounded by the light blocking members BK. The first wavelength converting unit WLC1 may include a first base resin BS1, a first scatterer SCT1, and a first wavelength shifter WLS1.

The first base resin BS1 may include a material having a relatively high light transmittance. The first base resin BS1 may be made of a transparent organic material. For example, the first base resin BS1 may include at least one of organic materials such as epoxy resin, acrylic resin, cardo resin, or imide resin.

The first scatterer SCT1 may have a refractive index different from that of the first base resin BS1 and may form an optical interface with the first base resin BS1. For example, the first scatterer SCT1 may include a light scattering material or light scattering particles that scatter at least a portion of transmitted light. For example, the first scatterer SCT1 may include metal oxide such as titanium oxide ($TiO_2$), zirconium oxide ($ZrO_2$), aluminum oxide ($Al_2O_3$), indium oxide ($In_2O_3$), zinc oxide (ZnO) or tin oxide ($SnO_2$) or may include organic particles such as acrylic resin or urethane resin. The first scatterer SCT1 may scatter incident light in random directions regardless of an incident direction of the incident light without substantially converting a peak wavelength of the incident light.

The first wavelength shifter WLS1 may convert or shift a peak wavelength of incident light into a first peak wavelength. For example, the first wavelength shifter WLS1 may convert blue light received from the display substrate 100 into red light having a single peak wavelength of 610 to 650 nm and emit the red light. The first wavelength shifter WLS1 may be quantum dots, quantum rods, or phosphors. The quantum dots may be particulate materials that emit light of a specific color when electrons transit from a conduction band to a valence band.

The quantum dots may be semiconductor nanocrystalline materials. The quantum dots may have a specific band gap according to their composition and size. Thus, the quantum dots may absorb light and then emit light having a unique wavelength. Examples of semiconductor nanocrystals of the quantum dots may include group IV nanocrystals, group II-VI compound nanocrystals, group III-V compound nanocrystals, group IV-VI nanocrystals, and combinations of the same.

The group II-VI compounds may be selected from binary compounds selected from CdSe, CdTe, ZnS, ZnSe, ZnTe, ZnO, HgS, HgSe, HgTe, MgSe, MgS and mixtures of the same; ternary compounds selected from InZnP, AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and mixtures of the same; and quaternary compounds selected from HgZnTeS, CdZnSeS, CdZnSeTe, CdZnSTe, CdHgSeS, CdHgSeTe, CdHgSTe, HgZnSeS, HgZnSeTe, HgZnSTe and mixtures of the same.

The group III-V compounds may be selected from binary compounds selected from GaN, GaP, GaAs, GaSb, AlN, AlP, AlAs, AlSb, InN, InP, InAs, InSb and mixtures of the same; ternary compounds selected from GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP and mixtures of the same; and quaternary compounds selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and mixtures of the same.

The group IV-VI compounds may be selected from binary compounds selected from SnS, SnSe, SnTe, PbS, PbSe, PbTe and mixtures of the same; ternary compounds selected from SnSeS, SnSeTe, SnSTe, PbSeS, PbSeTe, PbSTe, SnPbS, SnPbSe, SnPbTe and mixtures of the same; and quaternary compounds selected from SnPbSSe, SnPbSeTe, SnPbSTe and mixtures of the same. The group IV elements may be selected from silicon (Si), germanium (Ge), and a mixture of the same. The group IV compounds may be binary compounds selected from silicon carbide (SiC), silicon germanium (SiGe), and a mixture of the same.

For example, the binary, ternary or quaternary compounds may be present in particles at a uniform concentration or may be present in the same particles at partially different concentrations.

For example, the quantum dots may have a core-shell structure including a core containing the above-described nanocrystal and a shell surrounding the core. The shell of each quantum dot may serve as a protective layer for maintaining semiconductor characteristics by preventing or reducing chemical denaturation of the core and/or as a charging layer for giving electrophoretic characteristics to the quantum dot. The shell may be a single layer or a multilayer. An interface between the core and the shell may have a concentration gradient in which the concentration of an element present in the shell is reduced toward the center. The shell of each quantum dot may be made of, for example, a metal or non-metal oxide, a semiconductor compound, or a combination of the same.

For example, the metal or non-metal oxide may be, but is not limited to, a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$ or NiO or a ternary compound such as $MgAl_2O_4$, $CoFe_2O_4$, $NiFe_2O_4$ or $CoMn_2O_4$.

In addition, the semiconductor compound may be, but is not limited to, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, or AlSb.

Light emitted from the first wavelength shifter WLS1 may have a full width of half maximum (FWHM) of an emission wavelength spectrum of about 45 nm or less, about 40 nm or less, or about 30 nm or less and may further improve the color purity and color gamut of the display device 10. In addition, the light emitted from the first wavelength shifter WLS1 may be radiated in various directions regardless of the incident direction of incident light. Therefore, the lateral visibility of red color displayed in the first light transmitting area TA1 can be improved.

A portion of blue light provided by the display substrate 100 may be transmitted through the first wavelength converting unit WLC1 without being converted into red light by the first wavelength shifter WLS1. Of the blue light provided by the display substrate 100, light incident on the first color filter CF1 without being converted by the first wavelength converting unit WLC1 may be blocked by the first color filter CF1. In addition, red light into which a portion of the blue light provided by the display substrate 100 has been converted by the first wavelength converting unit WLC1 may be emitted to the outside through the first color filter CF1. Therefore, the first light transmitting area TA1 may emit red light.

The second wavelength converting unit WLC2 may be located on the second color filter CF2 to overlap the second light transmitting area TA2. The second wavelength converting unit WLC2 may be surrounded by the light blocking members BK. The second wavelength converting unit WLC2 may include a second base resin BS2, a second scatterer SCT2, and a second wavelength shifter WLS2.

The second base resin BS2 may include a material having a relatively high light transmittance. The second base resin BS2 may be made of a transparent organic material. For example, the second base resin BS2 may be made of the same material as the first base resin BS1 or may be formed using the materials exemplified in the description of the first base resin BS1.

The second scatterer SCT2 may have a refractive index different from that of the second base resin BS2 and may form an optical interface with the second base resin BS2. For example, the second scatterer SCT2 may include a light scattering material or light scattering particles that scatter at least a portion of transmitted light. For example, the second scatterer SCT2 may be made of the same material as the first scatterer SCT1 or may be formed using the materials exemplified in the description of the first scatterer SCT1. The second scatterer SCT2 may scatter incident light in random directions regardless of an incident direction of the incident light without substantially converting a peak wavelength of the incident light.

The second wavelength shifter WLS2 may convert or shift a peak wavelength of incident light into a second peak wavelength different from the first peak wavelength of the first wavelength shifter WLS1. For example, the second wavelength shifter WLS2 may convert blue light received from the display substrate 100 into green light having a single peak wavelength of 510 to 550 nm and emit the green light. The second wavelength shifter WLS2 may be quantum dots, quantum rods, or phosphors. The second wavelength shifter WLS2 may include a material having the same purpose as the materials exemplified in the description of the first wavelength shifter WLS1. The second wavelength shifter WLS2 may be made of quantum dots, quantum rods, or phosphors such that its wavelength conversion range is different from the wavelength conversion range of the first wavelength shifter WLS1.

The light transmitting unit LTU may be located on the third color filter CF3 to overlap the third light transmitting area TA3. The light transmitting unit LTU may be surrounded by the light blocking members BK. The light transmitting unit LTU may transmit incident light while maintaining a peak wavelength of the incident light. The light transmitting unit LTU may include a third base resin BS3 and a third scatterer SCT3.

The third base resin BS3 may include a material having a relatively high light transmittance. The third base resin BS3 may be made of a transparent organic material. For example, the third base resin BS3 may be made of the same material as the first or second base resin BS1 or BS2 or may be formed using the materials exemplified in the description of the first or second base resin BS1 or BS2.

The third scatterer SCT3 may have a refractive index different from that of the third base resin BS3 and may form an optical interface with the third base resin BS3. For example, the third scatterer SCT3 may include a light scattering material or light scattering particles that scatter at least a portion of transmitted light. For example, the third scatterer SCT3 may be made of the same material as the first or second scatterer SCT1 or SCT2 or may be formed using the materials exemplified in the description of the first or second scatterer SCT1 or SCT2. The third scatterer SCT3 may scatter incident light in random directions regardless of an incident direction of the incident light without substantially converting a peak wavelength of the incident light.

The third capping layer CAP3 may cover the first and second wavelength converting units WLC1 and WLC2, the light transmitting unit LTU, and the light blocking members BK. For example, the third capping layer CAP3 may seal the first and second wavelength converting units WLC1 and WLC2 and the light transmitting unit LTU, thereby preventing or reducing damage or contamination of the first and second wavelength converting units WLC1 and WLC2 and the light transmitting unit LTU. The third capping layer CAP3 may be made of the same material as the first or second capping layer CAP1 or CAP2 or may be formed using the materials exemplified in the description of the first or second capping layer CAP1 or CAP2.

The filler 500 may be located in the space between the display substrate 100 and the color conversion substrate 300 and may be surrounded by the sealing member 600. The filler 500 may fill the space between the display substrate 100 and the color conversion substrate 300. For example, the filler 500 may be made of an organic material and may transmit light. The filler 500 may be made of, but not necessarily limited to, a silicon-based organic material or an epoxy-based organic material. For another example, the filler 500 may be omitted.

The sealing member 600 may be interposed between the edges of the display substrate 100 and the edges of the color conversion substrate 300 in the non-display area NDA. The sealing member 600 may be arranged along the edges of the display substrate 100 and the color conversion substrate 300 in the non-display area NDA to seal the filler 500. The display substrate 100 and the color conversion substrate 300 may be bonded to each other through the sealing member 600. For example, the sealing member 600 may include an organic material. The sealing member 600 may be made of, but not necessarily limited to, epoxy-based resin.

The display device 10 may further include the connection pad 700 and an adhesive film 800.

The connection pad 700 may be located on at least one side surface of the display device 10. The connection pad 700 may extend from a side surface of the display substrate 100 to a side surface of the color conversion substrate 300. For example, the connection pad 700 may extend from the first base member SUB1 of the display substrate 100 to the second base member SUB2 of the color conversion substrate 300, but the present disclosure is not necessarily limited thereto. The connection pad 700 may receive various voltages or signals from the flexible films 210 and supply the voltages or signals to the connection wiring CWL.

The adhesive film 800 may attach the flexible films 210 to a surface of the connection pad 700. A surface of the adhesive film 800 may be attached to the surface of the connection pad 700, and the other surface of the adhesive film 800 may be attached to surfaces of the flexible films 210. For example, the adhesive film 800 may cover the whole of the connection pad 700, but the present disclosure is not necessarily limited thereto. For another example, the adhesive film 800 may cover a part of the connection pad 700 and expose the other part of the connection pad 700.

The adhesive film 800 may include an anisotropic conductive film. When the adhesive film 800 includes an anisotropic conductive film, it may have conductivity in an area where the connection pad 700 contacts contact pads of the flexible films 210 and may electrically connect the flexible films 210 to the connection pad 700.

Optically, the adhesive film 800 may be omitted. In this case, the flexible films 210 may directly contact the connection pad 700. For example, the contact pads of the flexible films 210 may be connected to the connection pad 700 using a method such as ultrasonic bonding or welding.

Each of the flexible films 210 may be located on the upper side or the lower side of the display substrate 100. Each of the flexible films 210 may extend from a side surface of the display device 10 to the lower surface of the display substrate 100. For example, each of the flexible films 210 may be located on the side surfaces of the display substrate 100 and the color conversion substrate 300 through side bonding. A side of each flexible film 210 may be connected to the connection wiring CWL of the display substrate 100 on the side surface of the display substrate 100, and the other side of each flexible film 210 may be connected to a source circuit board 230 on the lower surface of the display substrate 100. For example, each of the flexible films 210 may be an anisotropic conductive film and may transmit a signal of a source driver 220 or the source circuit board 230 to the display substrate 100.

The tiled display device TD may further include a light scattering member LSM located between a plurality of display devices 10. The light scattering member LSM may be located between the color conversion substrates 300 of the display devices 10. The light scattering member LSM may cover the connection pad 700, the adhesive film 800, and the flexible films 210 located on a side surface of each of the display devices 10. Therefore, the light scattering member LSM can control external light reflectance of the non-display areas NDA between the display devices 10

The light scattering member LSM may include a base resin BS and a scatterer SCT.

The base resin BS may include a material having a relatively high light transmittance. The base resin BS may be made of a transparent organic material. For example, the base resin BS may be made of the same material as the first through third base resins BS1 through BS3 of the color conversion substrate 300 or may be formed using the materials exemplified in the description of the first through third base resins BS1 through BS3.

The scatterer SCT may have a refractive index different from that of the base resin BS and may form an optical interface with the base resin BS. For example, the scatterer SCT may include a light scattering material or light scattering particles that scatter at least a portion of transmitted light. For example, the scatterer SCT may be made of the same material as the first through third scatterers SCT1 through SCT3 of the color conversion substrate 300 or may be formed using the materials exemplified in the description of the first through third scatterers SCT1 through SCT3. The scatterer SCT may scatter light, which is incident from the outside, in random directions, and a portion of the scattered light may be reflected back to the outside of the tiled display device TD.

Figure 7:
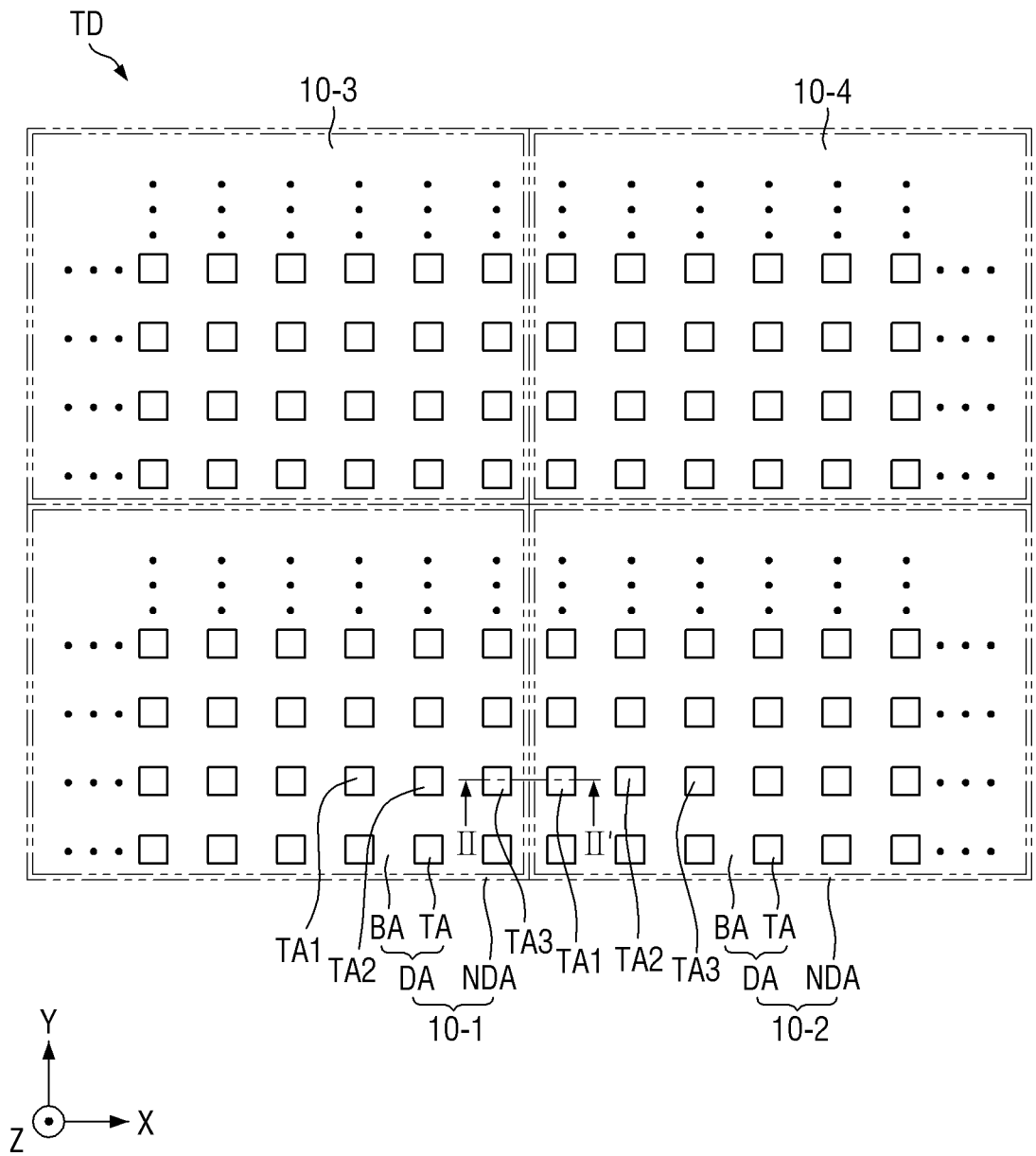
FIG. 7 is a plan view illustrating the structure of a tiled display device according to some example embodiments.
Figure 8:
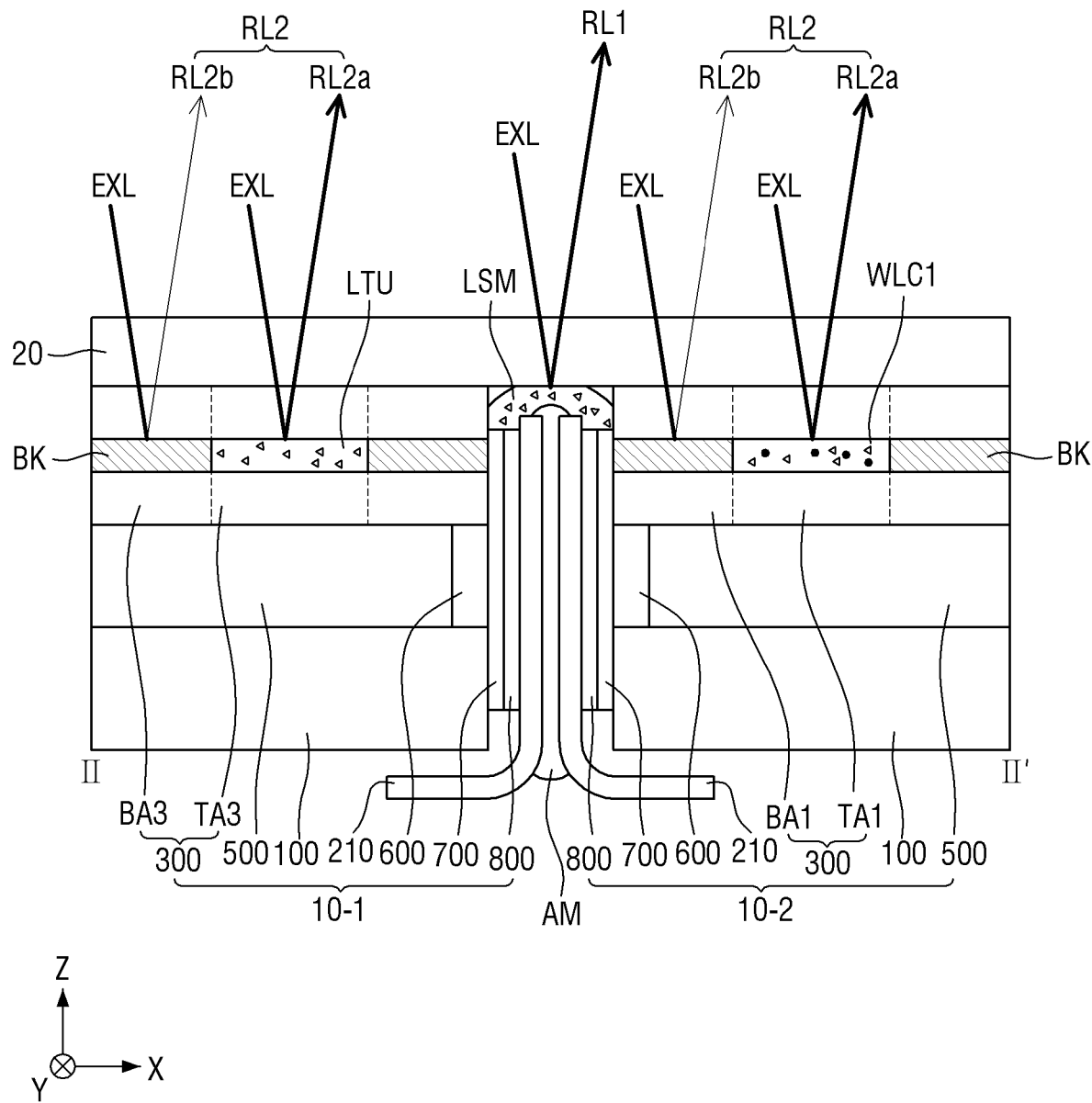
FIG. 8 is a cross-sectional view taken along the line II-II' of FIG. 7.

FIG. 7 is a plan view illustrating the structure of a tiled display device TD according to some example embodiments. FIG. 8 is a cross-sectional view taken along the line II-II' of FIG. 7. The tiled display device TD of FIG. 7 is formed by connecting the display devices 10 of FIGS. 1 and 2. A description of some of the same elements as those described above will be given briefly or may be omitted.

Referring to FIGS. 7 and 8, the tiled display device TD may include a plurality of display devices 10 and an adhesive member AM. For example, the tiled display device TD may include first through fourth display devices 10-1 through 10-4. However, the number of the display devices 10 is not limited to the embodiment illustrated in FIG. 7. The number of the display devices 10 may be determined by the size of each display device 10 and the size of the tiled display device TD.

The tiled display device TD may be formed by attaching side surfaces of adjacent display devices 10 to each other using the adhesive member AM located between the display devices 10. The adhesive member AM may connect side surfaces of the first through fourth display devices 10-1 through 10-4 arranged in a lattice shape, thereby realizing the tiled display device TD. For example, the adhesive member AM may be made of an adhesive or a double-sided tape having a relatively small thickness. Thus, a gap between the display devices 10 can be minimized.

Each of the first and second display devices 10-1 and 10-2 may include a connection pad 700, an adhesive film 800, and flexible films 210 located between the first and second display devices 10-1 and 10-2. For example, when the connection pad 700, the adhesive film 800, and the flexible films 210 are located on both sides (e.g., upper and lower sides or left and right sides) of each display device 10, each of the first and second display devices 10-1 and 10-2 may include the connection pad 700, the adhesive film 800 and the flexible films 210 located between the first and second display devices 10-1 and 10-2.

For another example, when the connection pad 700, the adhesive film 800, and the flexible films 210 are located on one side of the display device 10, one of the adjacent first and second display devices 10-1 and 10-2 may include the connection pad 700, the adhesive film 800 and the flexible films 210 located between the first and second display devices 10-1 and 10-2, and the other display device 10 may not include the connection pad 700, the adhesive film 800 and the flexible films 210 located between the first and second display devices 10-1 and 10-2. Therefore, unlike in the embodiment of FIG. 8, the connection pad 700, the adhesive film 800, and the flexible films 210 of one of the first and second display devices 10-1 and 10-2 may be omitted.

The connection pad 700 may be located on at least one side surface of each display device 10. The connection pad 700 may extend from a side surface of a display substrate 100 to a side surface of a color conversion substrate 300. For example, the connection pad 700 may extend from a first base member SUB1 of the display substrate 100 to a second base member SUB2 of the color conversion substrate 300, but the present disclosure is not necessarily limited thereto. The connection pad 700 may receive various voltages or signals from the flexible films 210 and supply the voltages or signals to a connection wiring CWL.

The adhesive film 800 may attach the flexible films 210 to a surface of the connection pad 700. A surface of the adhesive film 800 may be attached to the surface of the connection pad 700, and the other surface of the adhesive film 800 may be attached to surfaces of the flexible films 210. For example, the adhesive film 800 may cover the whole of the connection pad 700, but the present disclosure is not necessarily limited thereto. For another example, the adhesive film 800 may cover a part of the connection pad 700 and expose the other part of the connection pad 700.

The adhesive film 800 may include an anisotropic conductive film. When the adhesive film 800 includes an anisotropic conductive film, it may have conductivity in an area where the connection pad 700 contacts contact pads of the flexible films 210 and may electrically connect the flexible films 210 to the connection pad 700.

Optically, the adhesive film 800 may be omitted. In this case, the flexible films 210 may directly contact the connection pad 700. For example, the contact pads of the flexible films 210 may be connected to the connection pad 700 using a method such as ultrasonic bonding or welding.

Each of the flexible films 210 may be located on an upper side or a lower side of the display substrate 100. Each of the flexible films 210 may extend from a side surface of each display device 10 to a lower surface of the display substrate 100. For example, each of the flexible films 210 may be located on the side surfaces of the display substrate 100 and the color conversion substrate 300 through side bonding. A side of each flexible film 210 may be connected to the connection wiring CWL of the display substrate 100 on the side surface of the display substrate 100, and the other side of each flexible film 210 may be connected to a source circuit board 230 on the lower surface of the display substrate 100. For example, each of the flexible films 210 may be an anisotropic conductive film and may transmit a signal of a source driver 220 or the source circuit board 230 to the display substrate 100.

A light scattering member LSM may be arranged between the color conversion substrates 300 of the display devices 10. The light scattering member LSM may cover the connection pad 700, the adhesive film 800, and the flexible films 210 located on a side surface of each of the display devices 10. Therefore, the light scattering member LSM can control external light reflectance of non-display areas NDA between the display devices 10

External light reflectance of the light scattering member LSM may be substantially equal to external light reflectance of the color conversion substrate 300. The light scattering member LSM may reflect a portion of incident external light EXL by using a light scattering material, and the color conversion substrate 300 may reflect a portion of the incident external light EXL by using light scattering materials of first and second wavelength converting units WLC1 and WLC2 and a light transmitting unit LTU. For example, the light scattering member LSM may reflect a portion of the incident external light EXL by using a scatterer SCT, and the color conversion substrate 300 may reflect a portion of the incident external light EXL by using first through third scatterers SCT1 through SCT3. When the tiled display device TD receives the same amount of the external light EXL, the amount of reflected light RL1 of the light scattering member LSM may be substantially equal to the amount of reflected light RL2 of each of the first and second display devices 10-1 and 10-2. Therefore, the tiled display device TD may eliminate a sense of separation between the display devices 10 and improve a sense of immersion in images by preventing or reducing a boundary part or the non-display areas NDA between the display devices 10 being perceived.

The reflected light RL2 of the color conversion substrate 300 may include reflected light RL2a of a plurality of light transmitting areas TA including a light scattering material and reflected light RL2b of a plurality of light blocking areas BA not including a light scattering material. The light transmitting areas TA may correspond to the first and second wavelength converting units WLC1 and WLC2 and the light transmitting unit LTU, and the light blocking areas BA may correspond to a plurality of light blocking members BK.

The external light reflectance of the light scattering member LSM may be lower than external light reflectance of the light transmitting areas TA and higher than external light reflectance of the light blocking areas BA. For example, when the light scattering member LSM, the first and second wavelength converting units WLC1 and WLC2, and the light transmitting unit LTU include the same light scattering material, the external light reflectance of each of the light scattering member LSM, the first and second wavelength converting units WLC1 and WLC2 and the light transmitting unit LTU may be proportional to the amount of the light scattering material per unit volume. For example, the amount of the third scatterer SCT3 of the light transmitting unit LTU per unit volume may be greater than the amount of the scatterer SCT of the light scattering member LSM per unit volume.

The reflected light RL2 of the color conversion substrate 300 may correspond to the sum of the reflected light RL2a of the light transmitting areas TA and the reflected light RL2b of the light blocking areas BA. In addition, as the area of each light transmitting area TA of the color conversion substrate 300 increases, the amount of the reflected light RL2 of the color conversion substrate 300 may increase relatively. As the area of each light blocking area BA increases, the amount of the reflected light RL2 of the color conversion substrate 300 may decrease relatively. When the external light reflectance of the light scattering member LSM is lower than the external light reflectance of the light transmitting areas TA and higher than the external light reflectance of the light blocking areas BA, a difference between the external light reflectance of the light scattering member LSM and the external light reflectance of the color conversion substrate 300 may reach a level at which a user cannot perceive the non-display areas NDA or the boundary part between the display devices 10. Therefore, the tiled display device TD can prevent or reduce visibility or perceptibility of the non-display areas NDA or the boundary part between the display devices 10.

The external light reflectance of the light scattering member LSM may be higher than an average value of the external light reflectance of the light transmitting area TA and the external light reflectance of the light blocking areas BA. Here, the average value of the external light reflectance of the light transmitting areas TA and the external light reflectance of the light blocking areas BA may reflect an area ratio of the light transmitting areas TA to the light blocking areas BA. For example, when the tiled display device TD receives the same amount of the external light EXL and the area of each light transmitting area TA and the area of each light blocking area BA are equal, the average value of the reflected light RL2$a$ of the light transmitting areas TA and the reflected light RL2$b$ of the light blocking areas BA may correspond to a median value of the reflected light RL2$a$ of the light transmitting areas TA and the reflected light RL2$b$ of the light blocking areas BA (RL1>(RL2$a$+RL2$b$)/2). The difference between the external light reflectance of the light scattering member LSM and the external light reflectance of the color conversion substrate 300 may correspond to a level at which a user cannot perceive the non-display areas NDA or the boundary part between the display devices 10. Therefore, the tiled display device TD can prevent or reduce perceptibility or visibility of the non-display areas NDA or the boundary part between the display devices 10.

Figure 9:
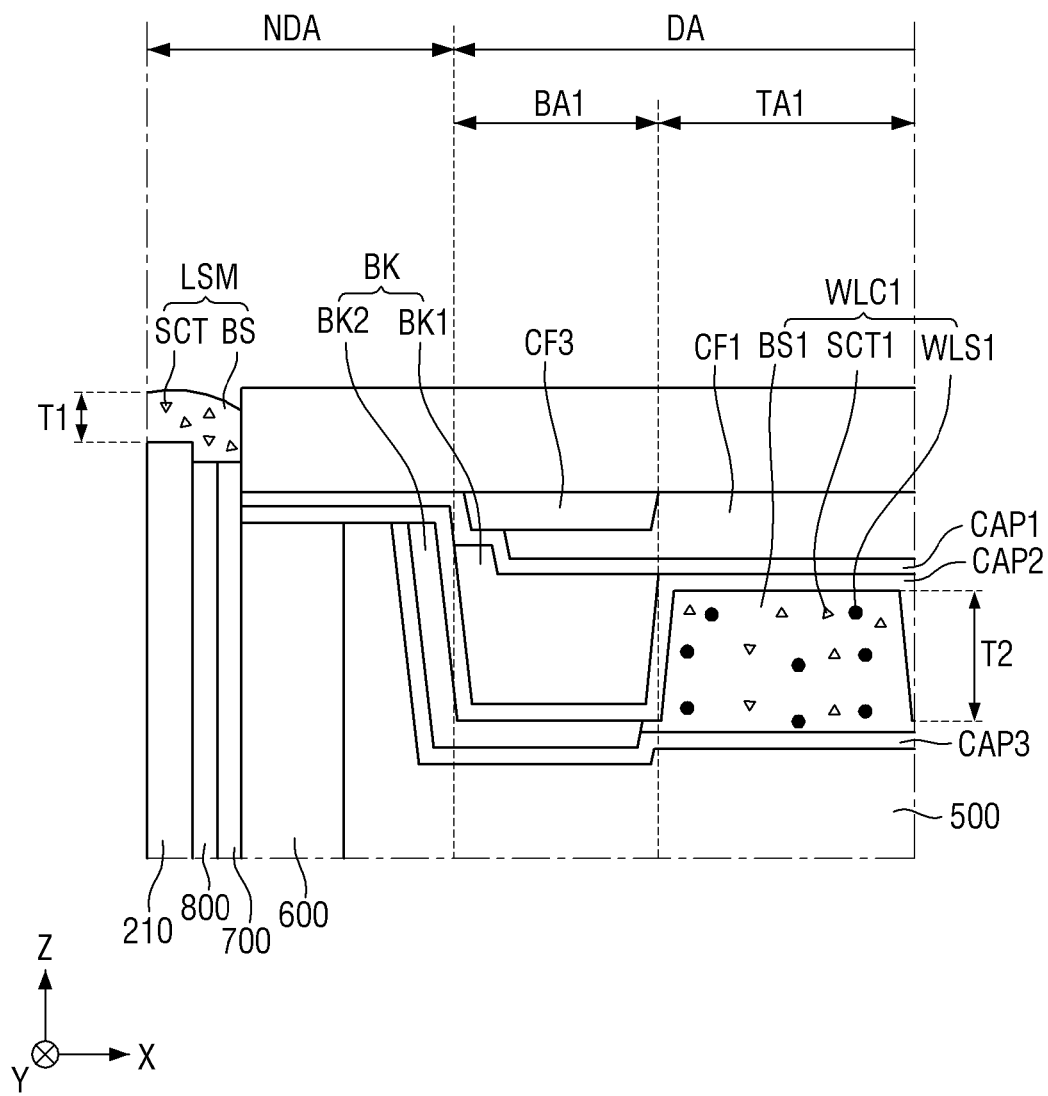
FIG. 9 is an enlarged view of a light scattering member and a first wavelength converting unit of FIG. 6.

FIG. 9 is an enlarged view of the light scattering member LSM and the first wavelength converting unit WLC1 of FIG. 6.

Referring to FIG. 9, a thickness T2 of the first wavelength converting unit WLC1, the second wavelength converting unit WLC2, or the light transmitting unit LTU may be greater than a thickness T1 of the light scattering member LSM. The respective thicknesses of the first wavelength converting unit WLC1, the second wavelength converting unit WLC2, and the light transmitting unit LTU may be slightly different depending on the stacked structure of the color conversion substrate 300. However, when the thickness T2 of each of the first wavelength converting unit WLC1, the second wavelength converting unit WLC2, and the light transmitting unit LTU is compared with the thickness T1 of the light scattering member LSM below, it is assumed that the thicknesses T2 of the first wavelength converting unit WLC1, the second wavelength converting unit WLC2, and the light transmitting unit LTU are substantially equal.

External light reflectance of the light transmitting areas TA may be higher than external light reflectance of the light scattering member LSM, and external light reflectance of the light blocking areas BA may be lower than the external light reflectance of the light scattering member LSM. For example, when the light scattering member LSM, the first and second wavelength converting units WLC1 and WLC2, and the light transmitting unit LTU include the same light scattering material, the external light reflectance of each of the light scattering member LSM, the first and second wavelength converting units WLC1 and WLC2, and the light transmitting unit LTU may be proportional to the amount of the light scattering material per unit volume.

Therefore, the thickness T2 of each of the first wavelength converting unit WLC1, the second wavelength converting unit WLC2, and the light transmitting unit LTU may be greater than the thickness T1 of the light scattering member LSM, and the amount of the third scatterer SCT3 of the light transmitting unit LTU per unit volume may be greater than the amount of the scatterer SCT of the light scattering member LSM per unit volume. The tiled display device TD can prevent or reduce perceptibility or visibility of the non-display areas NDA or a boundary part between a plurality of display devices 10.

Figure 10:
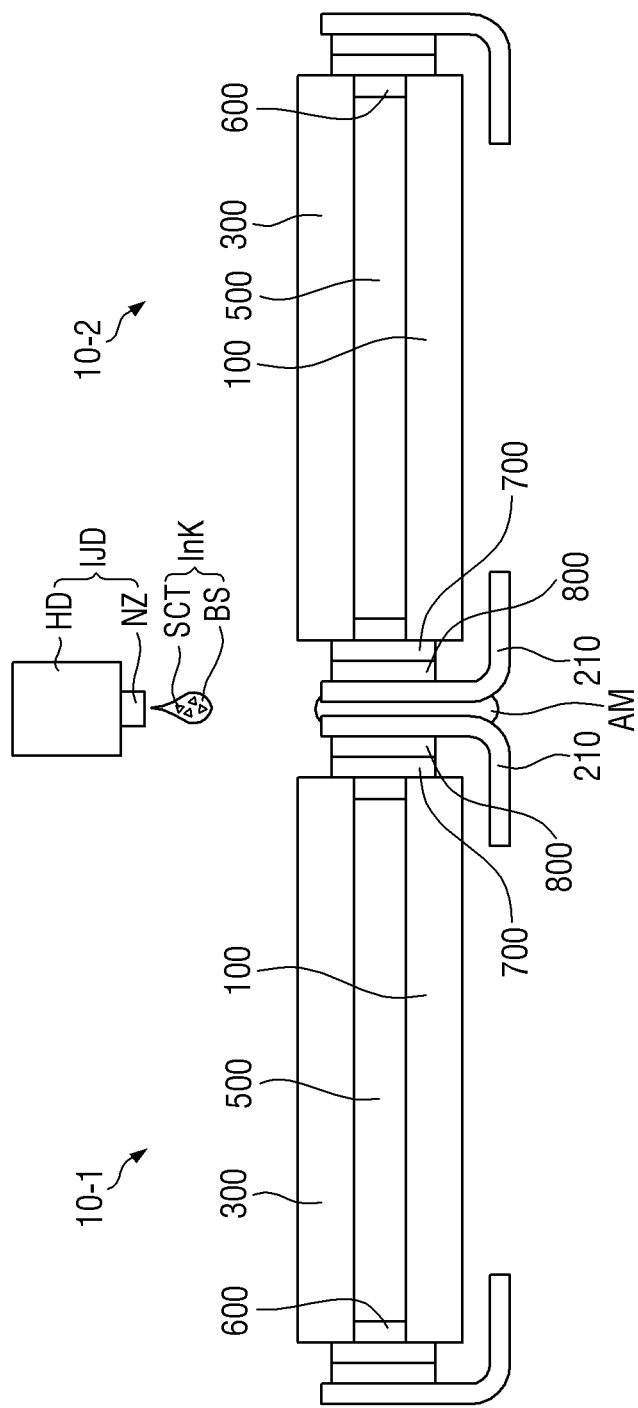
FIG. 10 illustrates an example of a process of forming a light scattering member in a tiled display device according to some example embodiments.

FIG. 10 illustrates an example of a process of forming a light scattering member LSM in a tiled display device TD according to some example embodiments.

Referring to FIG. 10, the tiled display device TD may be formed by attaching side surfaces of adjacent display devices 10 to each other using an adhesive member AM located between the display devices 10. To form the tiled display device TD, the display devices 10 may be bonded to each other using the adhesive member AM, and then the light scattering member LSM may be formed between the display devices 10 by using an ink ejector IJD. The ink ejector IJD may include an inkjet head HD and a nozzle NZ.

The inkjet head HD may be aligned at a position where the light scattering member LSM is to be formed between the display devices 10. The ink ejector IJD may spray ink including a base member BS and a scatterer SCT by using the nozzle NZ. The amount of the scatterer SCT of the ink may be determined based on the amounts of respective first through third scatterers SCT1 through SCT3 of first and second wavelength converting units WLC1 and WLC2 and a light transmitting unit LTU. For example, the amount of the scatterer SCT of the ink may be determined based on the area and thickness of the light scattering member LSM, the area and thickness of each of the first and second wavelength converting units WLC1 and WLC2 and the light transmitting unit LTU, and the amount of each of the first through third scatterers SCT1 through SCT3. The sprayed ink may cover connection pads 700, adhesive films 800, flexible films 210, and the adhesive member AM between the display devices 10. The ink applied between the display devices 10 may be heated and cured to provide the light scattering member LSM between the display devices 10.

Figure 11:
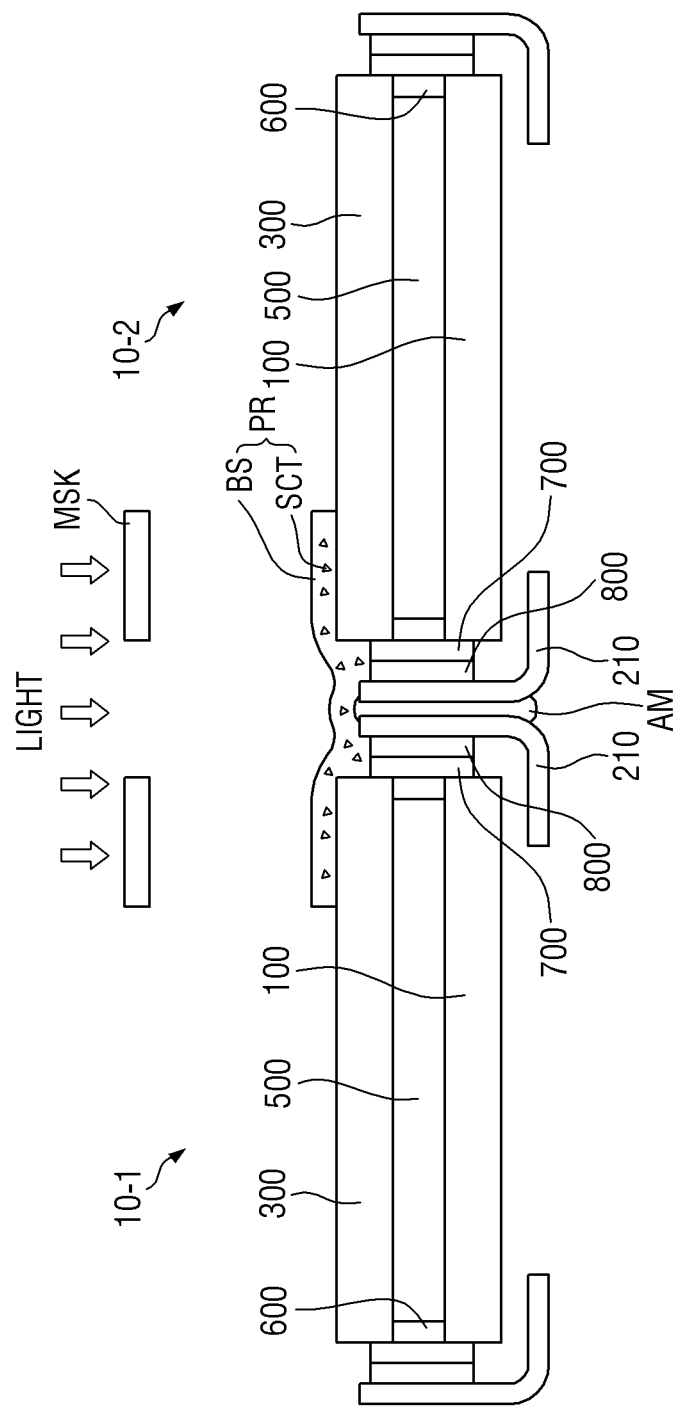
FIG. 11 illustrates an example of the process of forming a light scattering member in a tiled display device according to some example embodiments.

FIG. 11 illustrates an example of the process of forming a light scattering member LSM in a tiled display device TD according to some example embodiments.

Referring to FIG. 11, the tiled display device TD may be formed by attaching side surfaces of adjacent display devices 10 to each other using an adhesive member AM located between the display devices 10. To form the tiled display device TD, the display devices 10 may be bonded to each other using the adhesive member AM, and then the light scattering member LSM may be formed between the display devices 10 by using a photoresist PR. For example, the photoresist PR may include a base member BS and a scatterer SCT.

The amount of the scatterer SCT of the photoresist PR may be determined based on the amounts of respective first through third scatterers SCT1 through SCT3 of first and second wavelength converting units WLC1 and WLC2 and a light transmitting unit LTU. For example, the amount of the scatterer SCT of the photoresist PR may be determined based on the area and thickness of the light scattering member LSM, the area and thickness of each of the first and second wavelength converting units WLC1 and WLC2 and the light transmitting unit LTU, and the amount of each of the first through third scatterers SCT1 through SCT3.

For example, the photoresist PR may be a negative photoresist. The photoresist PR may be provided in a relatively wide area including a position where the light scattering member LSM to be provided between the display devices 10. When the photoresist PR is provided between the display devices 10, a mask MSK may be placed except for an area where the light scattering member LSM is to be provided. In the tiled display device TD, light may be irradiated toward the mask MSK and the photoresist PR, and an area other than the light scattering member LSM may be dissolved. Therefore, the light scattering member LSM may be provided between the display devices 10.

For another example, the photoresist PR may be a positive photoresist. In this case, the light scattering member LSM may be formed using a method not limited to that illustrated in FIG. 11 but corresponding to the positive photoresist.

Figure 12:
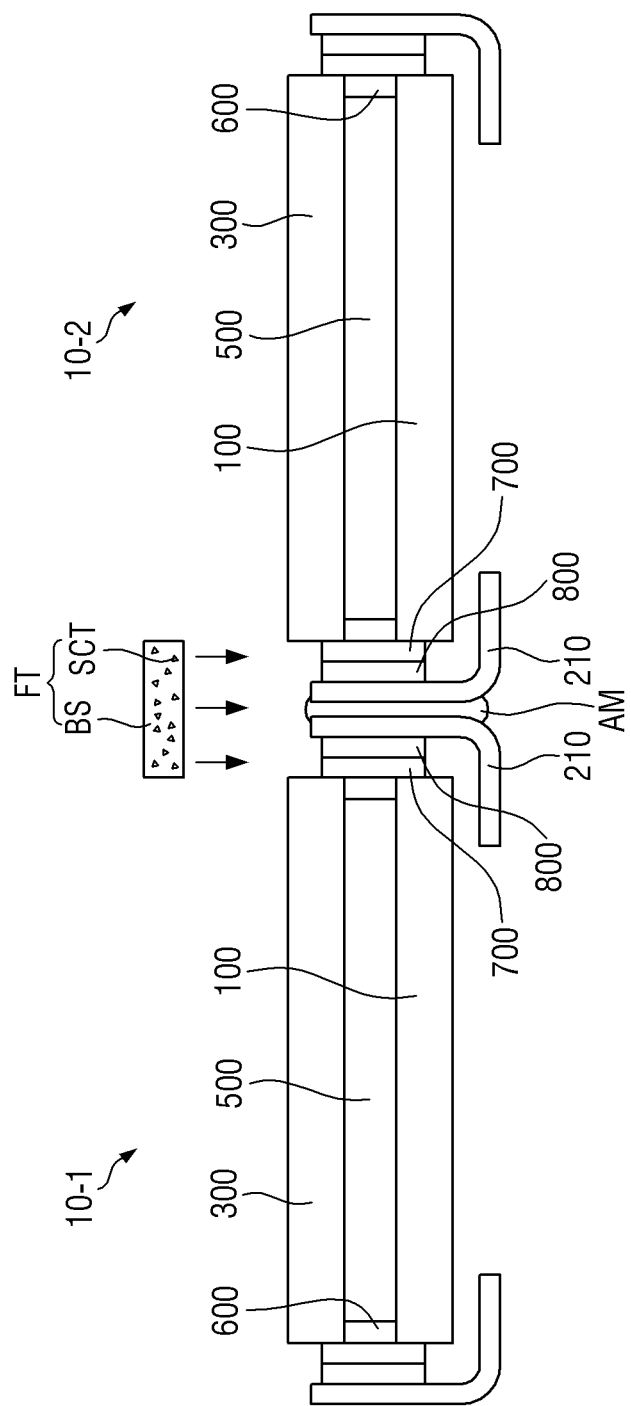
FIG. 12 illustrates an example of the process of forming a light scattering member in a tiled display device according to some example embodiments.

FIG. 12 illustrates an example of the process of forming a light scattering member LSM in a tiled display device TD according to some example embodiments.

Referring to FIG. 12, the tiled display device TD may be formed by attaching side surfaces of adjacent display devices 10 to each other using an adhesive member AM located between the display devices 10. To form the tiled display device TD, the display devices 10 may be bonded to each other using the adhesive member AM, and then the light scattering member LSM may be formed between the display devices 10 by using a film tape FT. For example, the film tape FT may have adhesive strength and include a base member BS and a scatterer SCT.

The amount of the scatterer SCT of the film tape FT may be determined based on the amounts of respective first through third scatterers SCT1 through SCT3 of first and second wavelength converting units WLC1 and WLC2 and a light transmitting unit LTU. For example, the amount of the scatterer SCT of the film tape FT may be determined based on the area and thickness of the light scattering member LSM, the area and thickness of each of the first and second wavelength converting units WLC1 and WLC2 and the light transmitting unit LTU, and the amount of each of the first through third scatterers SCT1 through SCT3.

Figure 13A:
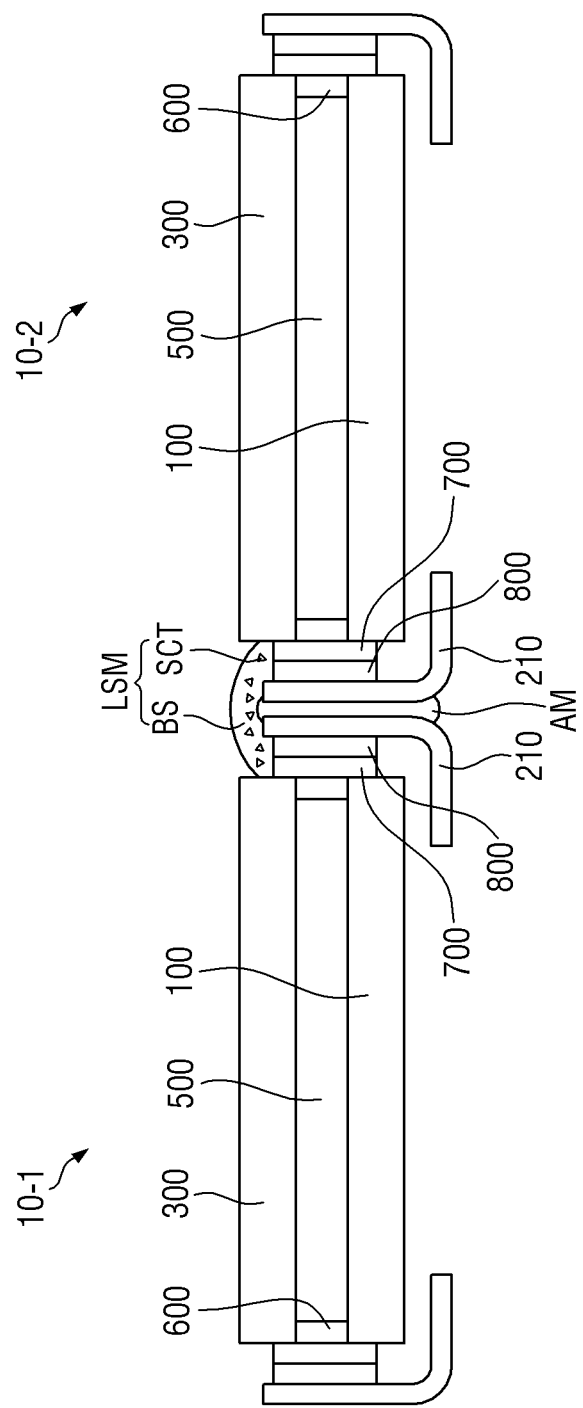
FIGS. 13A to 13C illustrate a process of manufacturing a tiled display device according to some example embodiments.
Figure 13B:
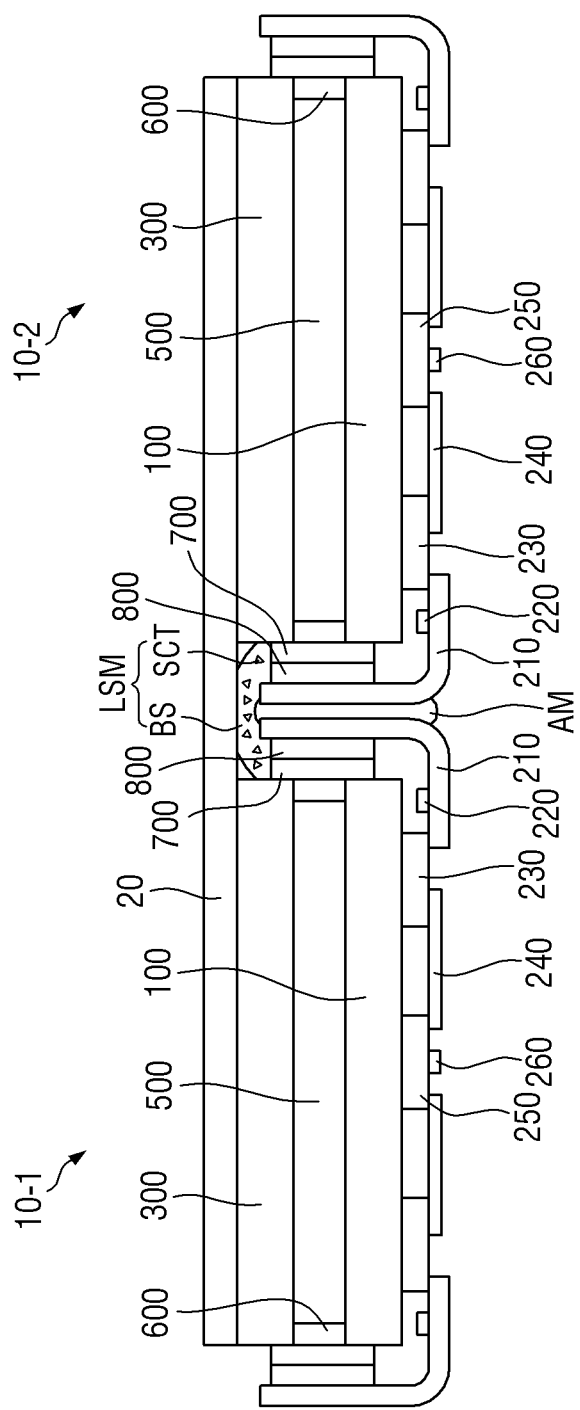
Figure 13C:
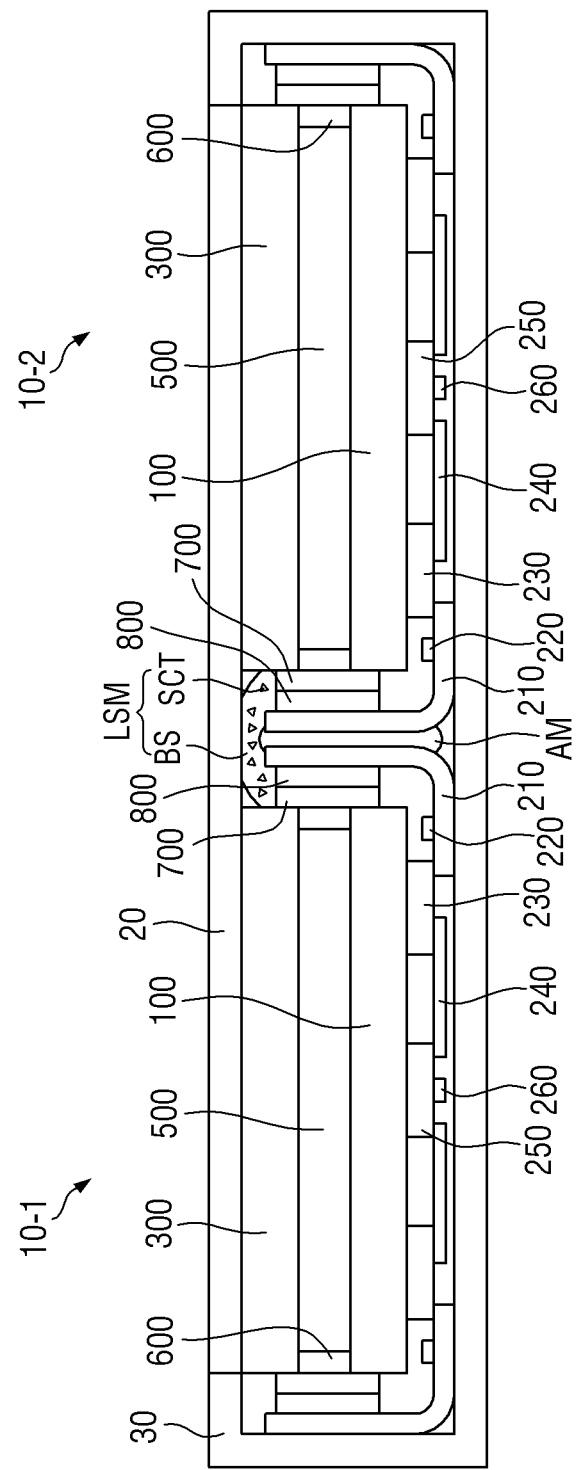

FIGS. 13A to 13C illustrate a process of manufacturing a tiled display device TD according to some example embodiments. FIGS. 13A through 13C illustrate the process of manufacturing the tiled display device TD in a time sequence.

Referring to FIG. 13A, side surfaces of adjacent display devices 10 may be attached to each other using an adhesive member AM located between the display devices 10. After the display devices 10 are bonded to each other using the adhesive member AM, a light scattering member LSM may be formed between the display devices 10 by using the inkjet method illustrated in FIG. 10, the photoresist method illustrated in FIG. 11, or the film tape method illustrated in FIG. 12. The light scattering member LSM may cover a connection pad 700, an adhesive film 800, flexible films 210, and the adhesive member AM located on a side surface of each of the display devices 10.

Referring to FIG. 13B, after the light scattering member LSM is formed between the display devices 10, a light control film 20 may be provided to cover the display devices 10 and the light scattering member LSM. For example, the light control film 20 may be a low reflection film and may reduce external light reflection of the tiled display device TD. The light control film 20 may be formed in one piece to cover the display devices 10 and the light scattering member LSM, but the present disclosure is not necessarily limited thereto.

After the light scattering member LSM is formed between the display devices 10, a printed circuit board process may be performed. For example, after the light scattering member LSM is formed between the display devices 10, a source circuit board 230, a plurality of cables 240, a control circuit board 250, and a timing controller 260 may be provided on a lower surface of a display substrate 100 of each of the display devices 10. The source circuit board 230 may be connected to the flexible films 210 or a plurality of source drivers 220.

Referring to FIG. 13C, after the formation of the light control film 20 and the printed circuit board process, a cover module 30 may be provided to cover side and lower surfaces of the tiled display device TD. Optionally, the cover module 30 may be provided on edges of a front surface of the tiled display device TD, but the present disclosure is not necessarily limited thereto. The cover module 30 may support and protect the display devices 10 and form the side and rear exterior of the tiled display device TD.

Figure 14A:
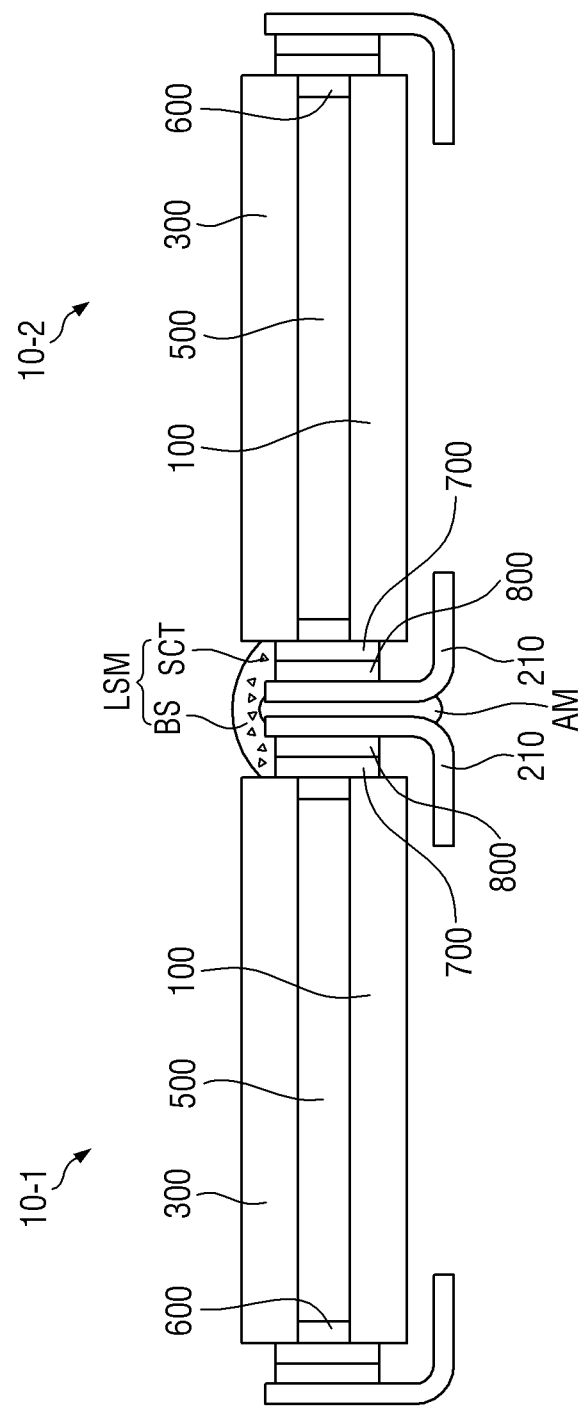
FIGS. 14A to 14C illustrate a process of manufacturing a tiled display device according to some example embodiments.
Figure 14B:
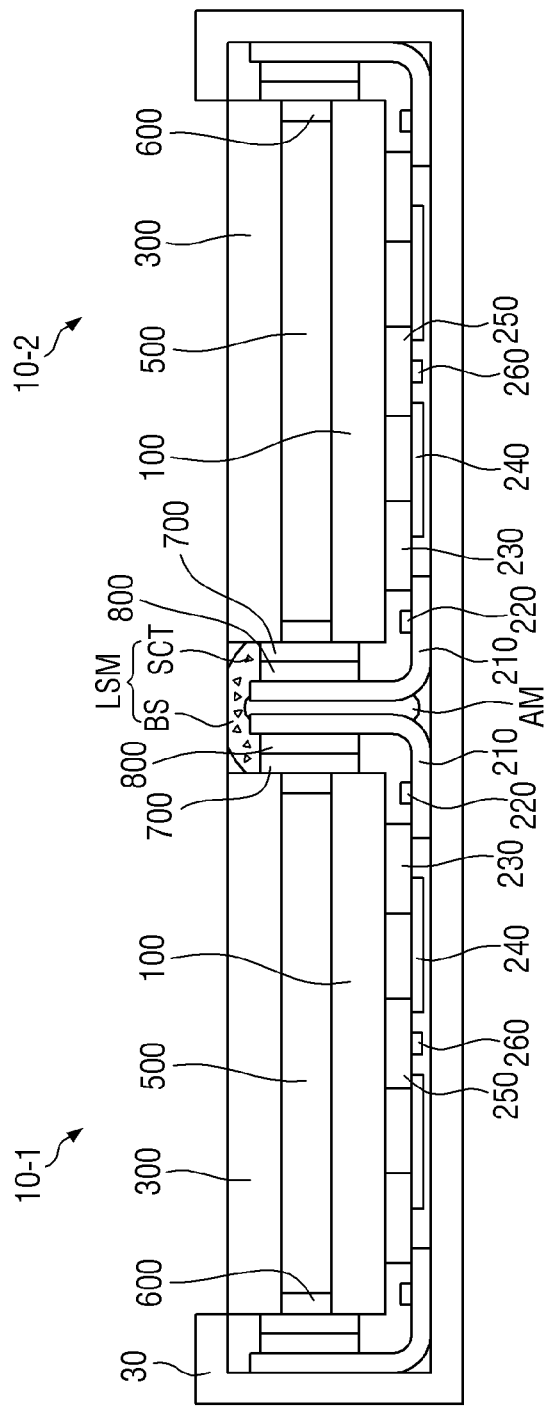
Figure 14C:
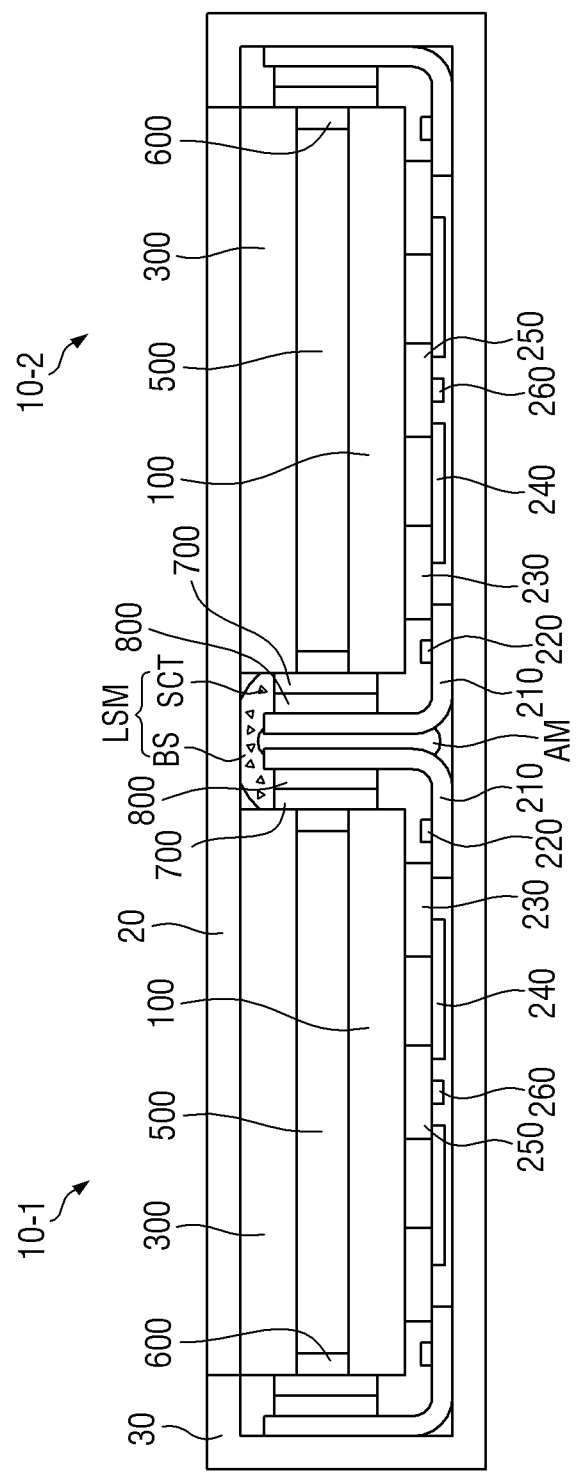

FIGS. 14A to 14C illustrate a process of manufacturing a tiled display device TD according to some example embodiments. FIGS. 14A through 14C illustrate the process of manufacturing the tiled display device TD in a time sequence.

Referring to FIG. 14A, side surfaces of adjacent display devices 10 may be attached to each other using an adhesive member AM located between the display devices 10. After the display devices 10 are bonded to each other using the adhesive member AM, a light scattering member LSM may be formed between the display devices 10 by using the inkjet method illustrated in FIG. 10, the photoresist method illustrated in FIG. 11, or the film tape method illustrated in FIG. 12. The light scattering member LSM may cover a connection pad 700, an adhesive film 800, flexible films 210, and the adhesive member AM located on a side surface of each of the display devices 10.

Referring to FIG. 14B, after the light scattering member LSM is formed between the display devices 10, a printed circuit board process may be performed. For example, after the light scattering member LSM is formed between the display devices 10, a source circuit board 230, a plurality of cables 240, a control circuit board 250, and a timing controller 260 may be provided on a lower surface of a display substrate 100 of each of the display devices 10. The source circuit board 230 may be connected to the flexible films 210 or a plurality of source drivers 220.

After the printed circuit board process is performed, a cover module 30 may be provided to cover side and lower surfaces of the tiled display device TD. Optionally, the cover module 30 may be provided on edges of a front surface of the tiled display device TD, but the present disclosure is not necessarily limited thereto. The cover module 30 may support and protect the display devices 10 and form the side and rear exterior of the tiled display device TD.

Referring to FIG. 14C, after the cover module 30 is provided, a light control film 20 may be provided to cover the display devices 10 and the light scattering member LSM. For example, the light control film 20 may be a low reflection film and may reduce external light reflection of the tiled display device TD. The light control film 20 may be formed in one piece to cover the display devices 10 and the light scattering member LSM, but the present disclosure is not necessarily limited thereto.

Figure 15A:
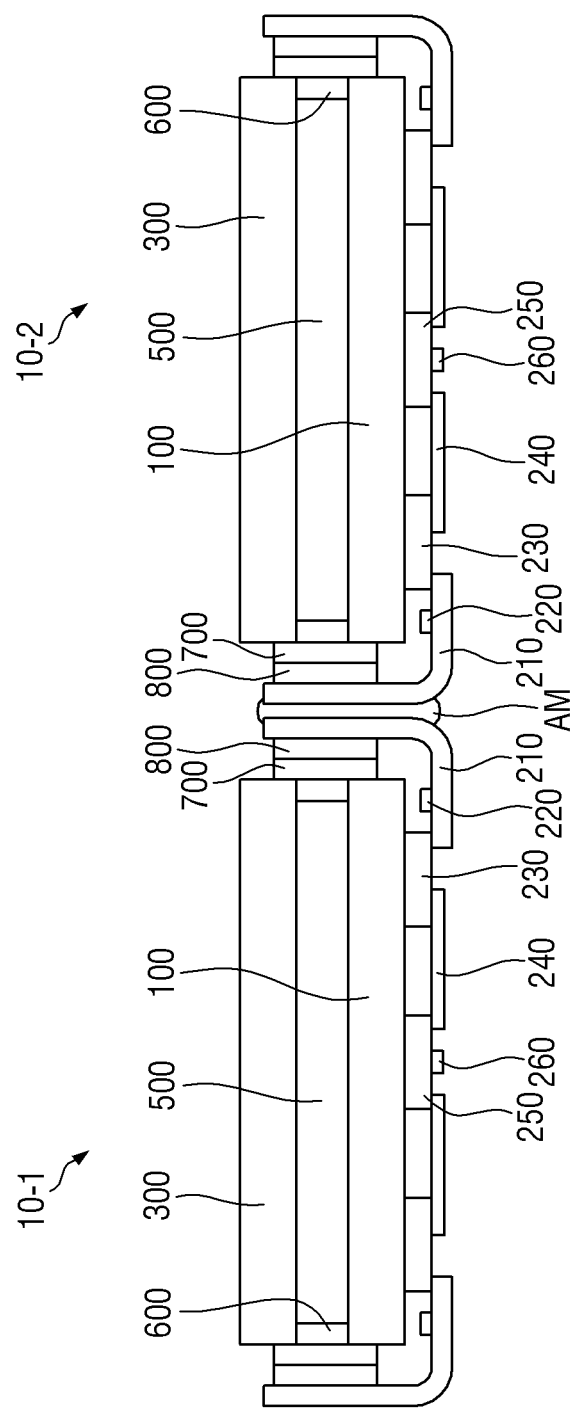
FIGS. 15A to 15C illustrate a process of manufacturing a tiled display device according to some example embodiments.
Figure 15B:
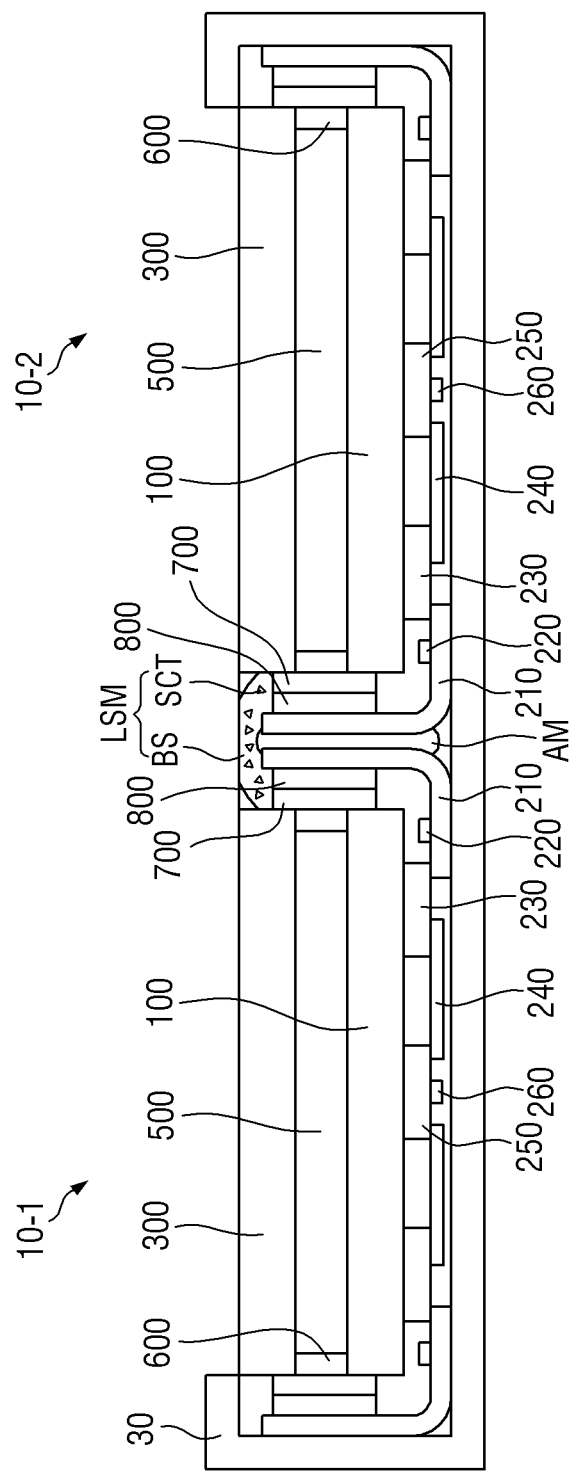
Figure 15C:
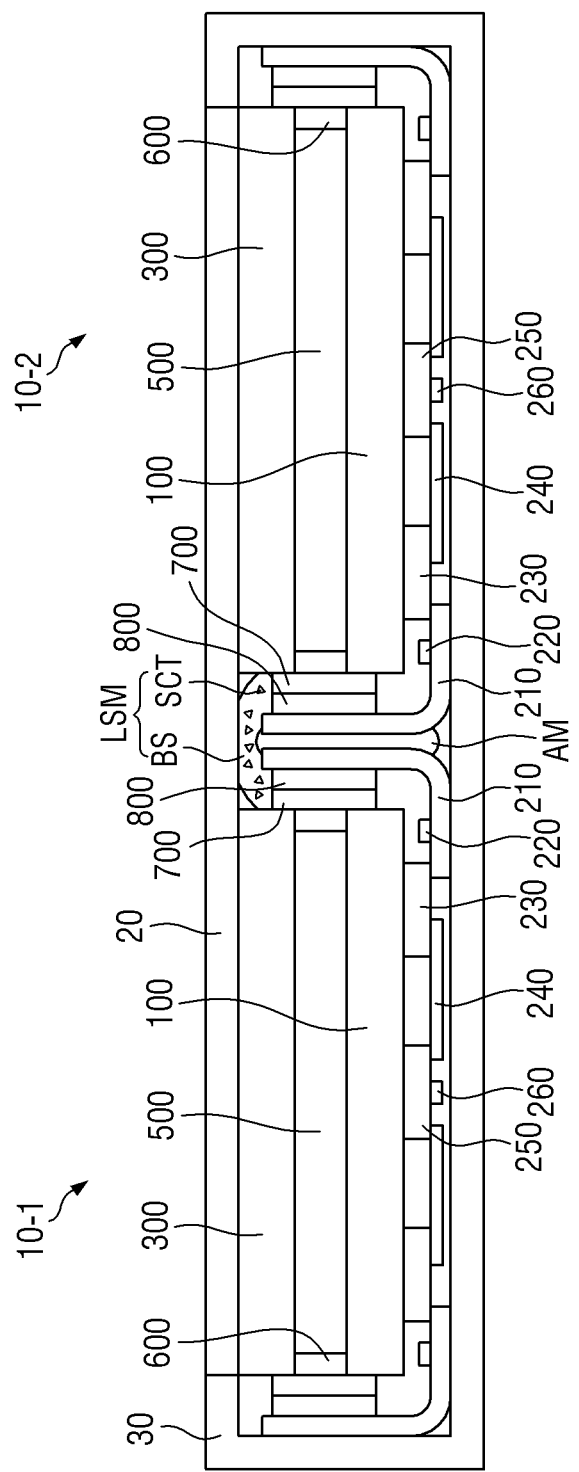

FIGS. 15A to 15C illustrate a process of manufacturing a tiled display device TD according to some example embodiments. FIGS. 15A through 15C illustrate the process of manufacturing the tiled display device TD in a time sequence.

Referring to FIG. 15A, side surfaces of adjacent display devices 10 may be attached to each other using an adhesive member AM located between the display devices 10. After the display devices 10 are bonded to each other using the adhesive member AM, a printed circuit board process may be performed. For example, after a light scattering member LSM is formed between the display devices 10, a source circuit board 230, a plurality of cables 240, a control circuit board 250, and a timing controller 260 may be provided on a lower surface of a display substrate 100 of each of the display devices 10. The source circuit board 230 may be connected to a plurality of flexible films 210 or a plurality of source drivers 220.

Referring to FIG. 15B, after the printed circuit board process is performed, the light scattering member LSM may be formed between the display devices 10 by using the inkjet method illustrated in FIG. 10, the photoresist method illustrated in FIG. 11, or the film tape method illustrated in FIG. 12. The light scattering member LSM may cover a connection pad 700, an adhesive film 800, the flexible films 210, and the adhesive member AM arranged on a side surface of each of the display devices 10.

After the printed circuit board process is performed, a cover module 30 may be provided to cover side and lower surfaces of the tiled display device TD. Optionally, the cover module 30 may be provided on edges of a front surface of the tiled display device TD, but the present disclosure is not necessarily limited thereto. The cover module 30 may support and protect the display devices 10 and form the side and rear exterior of the tiled display device TD.

Referring to FIG. 15C, after the cover module 30 is provided, a light control film 20 may be provided to cover the display devices 10 and the light scattering member LSM. For example, the light control film 20 may be a low reflection film and may reduce external light reflection of the tiled display device TD. The light control film 20 may be formed in one piece to cover the display devices 10 and the light scattering member LSM, but the present disclosure is not necessarily limited thereto.

Figure 16A:
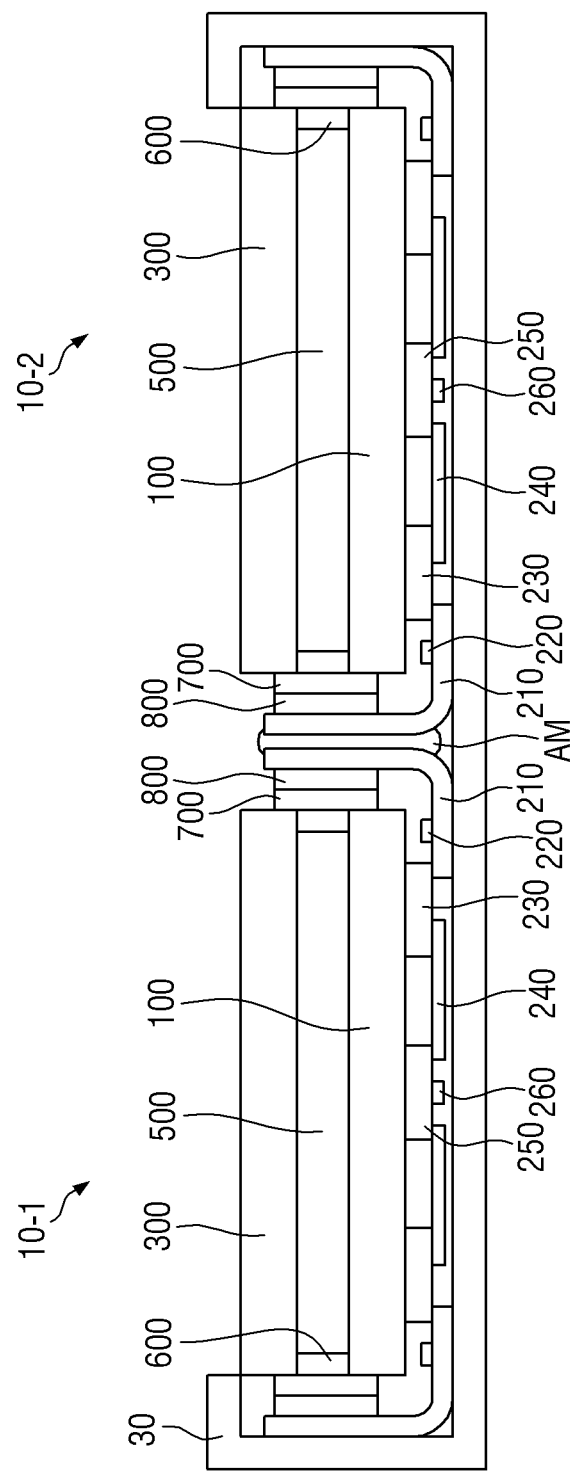
FIGS. 16A and 16B illustrate a process of manufacturing a tiled display device according to some example embodiments.
Figure 16B:
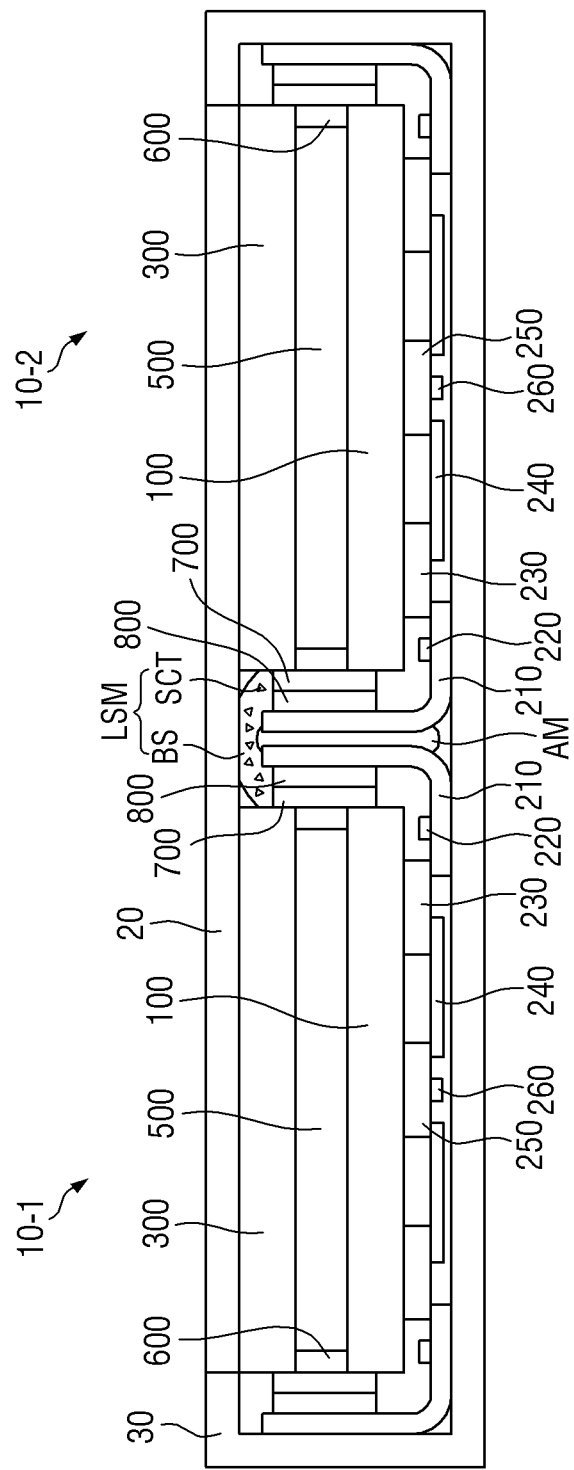

FIGS. 16A and 16B illustrate a process of manufacturing a tiled display device TD according to some example embodiments. FIGS. 16A and 16B illustrate the process of manufacturing the tiled display device TD in a time sequence.

Referring to FIG. 16A, side surfaces of adjacent display devices 10 may be attached to each other using an adhesive member AM located between the display devices 10. After the display devices 10 are bonded to each other using the adhesive member AM, a printed circuit board process may be performed. For example, after a light scattering member LSM is formed between the display devices 10, a source circuit board 230, a plurality of cables 240, a control circuit board 250, and a timing controller 260 may be provided on a lower surface of a display substrate 100 of each of the display devices 10. The source circuit board 230 may be connected to a plurality of flexible films 210 or a plurality of source drivers 220.

After the printed circuit board process is performed, a cover module 30 may be provided to cover side and lower surfaces of the tiled display device TD. Optionally, the cover module 30 may be provided on edges of a front surface of the tiled display device TD, but the present disclosure is not necessarily limited thereto. The cover module 30 may support and protect the display devices 10 and form the side and rear exterior of the tiled display device TD.

Referring to FIG. 16B, after the cover module 30 is provided, the light scattering member LSM may be formed between the display devices 10 by using the inkjet method illustrated in FIG. 10, the photoresist method illustrated in FIG. 11, or the film tape method illustrated in FIG. 12. The light scattering member LSM may cover a connection pad 700, an adhesive film 800, the flexible films 210, and the adhesive member AM located on a side surface of each of the display devices 10.

After the light scattering member LSM is formed between the display devices 10, a light control film 20 may be provided to cover the display devices 10 and the light scattering member LSM. For example, the light control film 20 may be a low reflection film and may reduce external light reflection of the tiled display device TD. The light control film 20 may be formed in one piece to cover the display devices 10 and the light scattering member LSM, but the present disclosure is not necessarily limited thereto.

A tiled display device according to embodiments includes a light scattering member located between a plurality of display devices and including a light scattering material. Therefore, external light reflectance of a display area of each of the display devices may be substantially equal to external light reflectance of non-display areas between the display devices. Therefore, the tiled display device can eliminate or reduce a sense of separation between the display devices and improve a sense of immersion in images by preventing or reducing the perceptibility or visibility of a boundary part or the non-display areas between the display devices.

However, the effects and characteristics of the embodiments according to the present disclosure are not restricted to those specifically set forth herein. The above and other effects and characteristics of the embodiments will become more apparent to one of ordinary skill in the art to which the embodiments pertain by referencing the claims and their equivalents.

What is claimed is:

1. A tiled display device comprising:
   a first display device comprising:
      a first display substrate having a plurality of light emitting areas; and
      a first color conversion substrate comprising a plurality of light transmitting areas respectively corresponding to the light emitting areas and comprising a light scattering material and a plurality of light blocking areas between the light transmitting areas;
   a second display device comprising a second display substrate and a second color conversion substrate, the second display device being at a side of the first display device; and
   a light scattering member between the first display device and the second display device and comprising a light scattering material,
   wherein an external light reflectance of the light scattering member is higher than an average value of an external light reflectance of the light transmitting areas and an external light reflectance of the light blocking areas,
   wherein the first display device further comprises:
   a connection pad on side surfaces of the first display substrate and the first color conversion substrate bonded to each other; and
   a flexible film below the light scattering member on a surface of the connection pad using an adhesive film,
   wherein the light scattering member covers an upper surface of at least one of the connection pad, the adhesive film, or the flexible film.

2. The tiled display device of claim 1, wherein the external light reflectance of the light scattering member is equal to an external light reflectance of the first and second color conversion substrates.

3. The tiled display device of claim 1, wherein the external light reflectance of the light scattering member is lower than the external light reflectance of the light transmitting areas and higher than the external light reflectance of the light blocking areas.

4. The tiled display device of claim 1, wherein the first and second color conversion substrates each comprise:
   a base member which comprises the light transmitting areas and the light blocking areas;
   a plurality of color filters on the base member;

a plurality of wavelength converters on the color filters to correspond to some of the light transmitting areas and comprising the light scattering material; and a light transmitter on the color filters to correspond to the other one of the light transmitting areas and comprising the light scattering material.

5. The tiled display device of claim 4, wherein the color filters comprise:
   a first color filter configured to transmit light of a first color and overlapping a first light transmitting area among the light transmitting areas;
   a second color filter configured to transmit light of a second color and overlapping a second light transmitting area among the light transmitting areas; and
   a third color filter configured to transmit light of a third color and overlapping a third light transmitting area among the light transmitting areas and the light blocking areas.

6. The tiled display device of claim 5, wherein the wavelength converters comprise:
   a first wavelength converter on the first color filter and comprising a first wavelength shifter configured to convert a peak wavelength of incident light into a first peak wavelength and the light scattering material; and
   a second wavelength converter on the second color filter and comprising a second wavelength shifter configured to convert a peak wavelength of incident light into a second peak wavelength different from the first peak wavelength and the light scattering material.

7. The tiled display device of claim 6, wherein the first wavelength converter or the second wavelength converter is thicker than the light scattering member.

8. The tiled display device of claim 5, wherein the light transmitter is on the third color filter and is configured to transmit incident light while maintaining a peak wavelength of the incident light using the light scattering material.

9. The tiled display device of claim 4, wherein the light transmitter is thicker than the light scattering member.

10. The tiled display device of claim 4, wherein the amount of the light scattering material of the light transmitter per unit volume is greater than the amount of the light scattering material of the light scattering member per unit volume.

11. The tiled display device of claim 1, further comprising a light control film covering the first display device, the second display device, and the light scattering member.

12. The tiled display device of claim 11, further comprising a cover module covering side and lower surfaces of the first display device and the second display device.

13. A tiled display device comprising:
    a first display device comprising:
      a first display substrate having a plurality of light emitting areas; and
      a first color conversion substrate comprising a plurality of light transmitting areas arranged to respectively correspond to the light emitting areas and comprising a light scattering material and a plurality of light blocking areas between the light transmitting areas;
    a second display device comprising a second display substrate and a second color conversion substrate, the second display device being at a side of the first display device; and
    a light scattering member between the first display device and the second display device and comprising a light scattering material,
    wherein an external light reflectance of the light scattering member is equal to an external light reflectance of the first and second color conversion substrates,
    wherein the first display device further comprises:
      a connection pad on side surfaces of the first display substrate and the first color conversion substrate bonded to each other; and
      a flexible film below the light scattering member on a surface of the connection pad using an adhesive film,
    wherein the light scattering member covers an upper surface of at least one of the connection pad, the adhesive film, or the flexible film.

14. The tiled display device of claim 13, wherein the external light reflectance of the light scattering member is lower than an external light reflectance of the light transmitting areas and higher than an external light reflectance of the light blocking areas.

15. The tiled display device of claim 13, wherein the first color conversion substrate comprises:
    a base member comprising the light transmitting areas and the light blocking areas;
    first to third color filters on the base member;
    a first wavelength converter on the first color filter and comprising a first wavelength shifter configured to convert a peak wavelength of incident light into a first peak wavelength and the light scattering material;
    a second wavelength converter on the second color filter and comprising a second wavelength shifter configured to convert a peak wavelength of incident light into a second peak wavelength different from the first peak wavelength and the light scattering material; and
    a light transmitter on the third color filter and configured to transmit incident light while maintaining a peak wavelength of the incident light using the light scattering material.

16. The tiled display device of claim 15, wherein the first wavelength converter, the second wavelength converter, or the light transmitter is thicker than the light scattering member.

17. The tiled display device of claim 15, wherein the amount of the light scattering material of the light transmitter per unit volume is greater than the amount of the light scattering material of the light scattering member per unit volume.

* * * * *